US012176363B2

(12) United States Patent
Yamakawa

(10) Patent No.: US 12,176,363 B2
(45) Date of Patent: Dec. 24, 2024

(54) IMAGING DEVICE AND ELECTRONIC DEVICE

(71) Applicant: SONY SEMICONDUCTOR SOLUTIONS CORPORATION, Kanagawa (JP)

(72) Inventor: Shinya Yamakawa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/414,099

(22) Filed: Jan. 16, 2024

(65) Prior Publication Data
US 2024/0153971 A1 May 9, 2024

Related U.S. Application Data

(63) Continuation of application No. 17/770,182, filed as application No. PCT/JP2020/035286 on Sep. 17, 2020, now Pat. No. 11,942,493.

(30) Foreign Application Priority Data

Oct. 29, 2019 (JP) .................................. 2019-196095

(51) Int. Cl.
*H04N 25/75* (2023.01)
*H01L 27/146* (2006.01)
*H04N 25/77* (2023.01)

(52) U.S. Cl.
CPC .. *H01L 27/14616* (2013.01); *H01L 27/14603* (2013.01); *H01L 27/14614* (2013.01);
(Continued)

(58) Field of Classification Search
CPC ......... H01L 27/14616; H01L 27/14603; H01L 27/14614; H01L 27/14689;
(Continued)

(56) References Cited

U.S. PATENT DOCUMENTS

2007/0189094 A1* 8/2007 Ohsawa .............. H01L 29/7841
365/189.16
2011/0053361 A1* 3/2011 Muralidhar ......... H01L 21/3086
438/585
(Continued)

FOREIGN PATENT DOCUMENTS

JP H03-262110 11/1991
JP 2017-183636 10/2017
(Continued)

OTHER PUBLICATIONS

International Search Report and Written Opinion for International (PCT) Patent Application No. PCT/JP2020/035286, dated Dec. 1, 2020, 6 pages.
(Continued)

*Primary Examiner* — Mekonnen D Dagnew
(74) *Attorney, Agent, or Firm* — SHERIDAN ROSS P.C.

(57) ABSTRACT

An imaging device in which noise can be reduced, and an electronic device using this device. The imaging device includes a light receiving element, and a read circuit. A field effect transistor in the read circuit has a semiconductor layer in which a channel is formed, a gate electrode that covers the semiconductor layer, and a gate insulating film disposed between the semiconductor layer and the gate electrode. The semiconductor layer has a main surface, and a first side surface on one end side of the main surface in a gate width direction of the field effect transistor. The gate electrode has a first portion that faces the main surface via the gate insulating film, and a second portion that faces the first side surface via the gate insulating film. A crystal plane of the first side surface is a plane or a plane equivalent to the plane.

10 Claims, 23 Drawing Sheets

(52) U.S. Cl.
CPC ....... *H01L 27/14689* (2013.01); *H04N 25/75* (2023.01); *H01L 27/14645* (2013.01); *H04N 25/77* (2023.01)

(58) Field of Classification Search
CPC ........... H01L 27/14645; H01L 21/3205; H01L 21/768; H01L 23/522; H01L 27/146; H01L 27/14643; H04N 25/75; H04N 25/77; H04N 25/78; H04N 25/76
See application file for complete search history.

(56) References Cited

U.S. PATENT DOCUMENTS

| | | | | |
|---|---|---|---|---|
| 2013/0107097 | A1* | 5/2013 | Suyama | H04N 23/54 |
| | | | | 348/311 |
| 2014/0374571 | A1* | 12/2014 | Okamoto | H04N 25/00 |
| | | | | 250/208.1 |
| 2017/0025415 | A1* | 1/2017 | Kurokawa | G11C 5/06 |
| 2019/0123079 | A1* | 4/2019 | Kudoh | H01L 29/4236 |
| 2022/0302192 | A1 | 9/2022 | Yamakawa | |

FOREIGN PATENT DOCUMENTS

| | | |
|---|---|---|
| JP | 2017-228751 | 12/2017 |
| TW | I660490 B | 5/2019 |

OTHER PUBLICATIONS

Notice of Allowance for U.S. Appl. No. 17/770,182, dated Nov. 13, 2023, 12 pages.

\* cited by examiner

IMAGING DEVICE AND ELECTRONIC DEVICE

CROSS REFERENCE TO RELATED APPLICATIONS

This application is a continuation of U.S. patent application Ser. No. 17/770,182, filed Apr. 19, 2022, which is a national stage application under 35 U.S.C. 371 and claims the benefit of PCT Application No. PCT/JP2020/035286, having an international filing date of Sep. 17, 2020, which designated the United States, which PCT application claimed the benefit of Japanese Patent Application No. 2019-196095, filed Oct. 29, 2019, the entire disclosures of each of which are incorporated herein by reference.

TECHNICAL FIELD

The present disclosure relates to an imaging device and an electronic device.

BACKGROUND ART

A solid-state imaging device including a gate electrode having at least one fin portion is known (see, for example, PTL 1).

CITATION LIST

Patent Literature

[PTL 1]
JP 2017-183636 A

SUMMARY

Technical Problem

It is desired to reduce noise in an imaging device.

The present disclosure has been made in view of such circumstances, and an object thereof is to provide an imaging device in which noise can be reduced, and an electronic device using this imaging device.

Solution to Problem

An imaging device according to one aspect of the present disclosure includes a light receiving element, and a read circuit configured to read an electric signal photoelectrically converted by the light receiving element. A field effect transistor included in the read circuit includes a semiconductor layer in which a channel is formed, a gate electrode configured to cover the semiconductor layer, and a gate insulating film disposed between the semiconductor layer and the gate electrode. The semiconductor layer includes a main surface, and a first side surface located on one end side of the main surface in a gate width direction of the field effect transistor. The gate electrode includes a first portion configured to face the main surface via the gate insulating film, and a second portion configured to face the first side surface via the gate insulating film. The first side surface is a surface of which a crystal plane is a (100) plane or a plane equivalent to the (100) plane.

According to this, the field effect transistor included in the read circuit can reduce an interface state of the first side surface on which the channel is formed, and can reduce an electric charge (for example, electrons) trapped in the interface state. Thus, the imaging device can reduce noise (for example, 1/f noise) caused by the above-mentioned interface state.

An electronic device according to one aspect of the present disclosure includes an optical component, an imaging device on which light transmitted through the optical component is incident, and a signal processing circuit configured to process a signal output from the imaging device. The imaging device includes a light receiving element, and a read circuit configured to read an electric signal photoelectrically converted by the light receiving element. A field effect transistor included in the read circuit includes a semiconductor layer in which a channel is formed, a gate electrode configured to cover the semiconductor layer, and a gate insulating film disposed between the semiconductor layer and the gate electrode. The semiconductor layer includes a main surface, and a first side surface located on one end side of the main surface in a gate width direction of the field effect transistor. The gate electrode includes a first portion configured to face the main surface via the gate insulating film, and a second portion configured to face the first side surface via the gate insulating film. The first side surface is a plane of which a crystal plane is a (100) plane or a plane equivalent to the (100) plane.

According to this, the electronic device can use the imaging device in which noise can be reduced. Thus, improvement of performance of the electronic device can be achieved.

DESCRIPTION OF EMBODIMENTS

Figure 1:
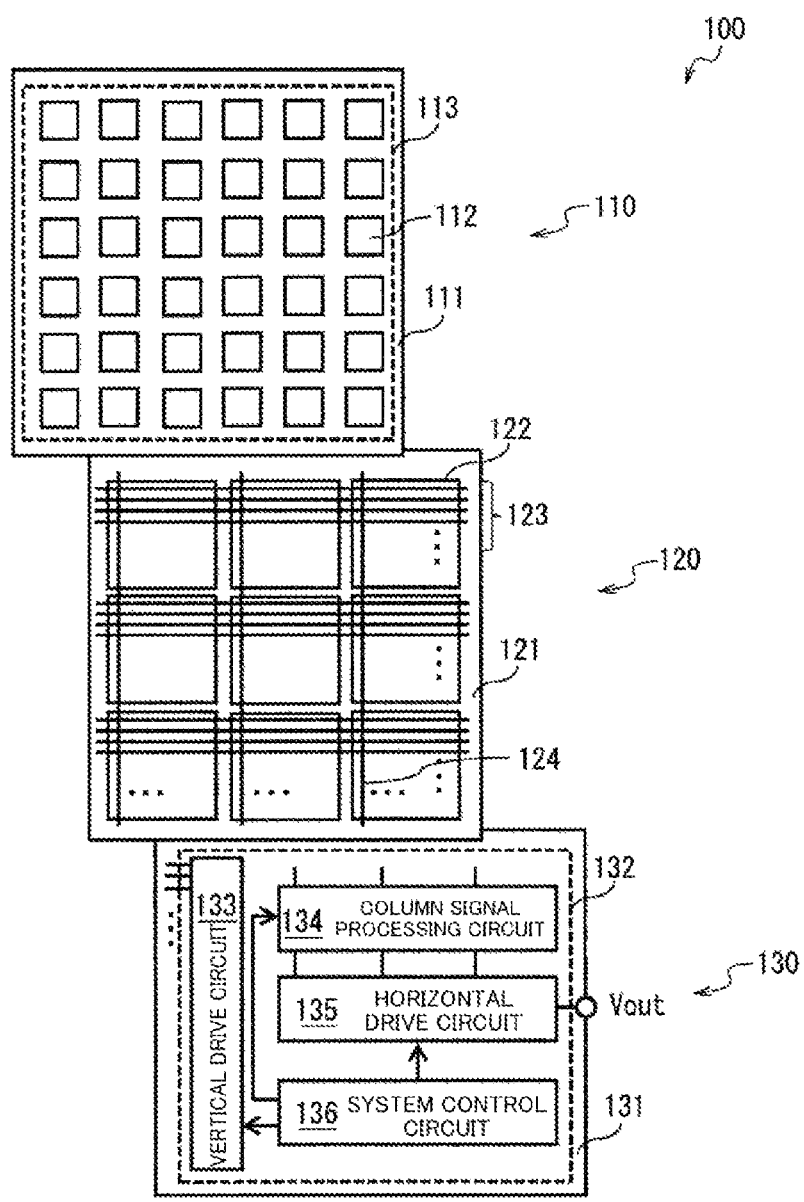
FIG. 1 is a schematic diagram showing a configuration example of an imaging device according to a first embodiment of the present disclosure.

Embodiments of the present disclosure will be described below with reference to the figures. In the illustration of the figures referred to in the following description, the same or similar portions will be denoted by the same or similar reference numerals. However, it should be noted that the figures are schematic and relationships between thicknesses and planar dimensions, ratios of thicknesses of respective layers, and the like are different from actual ones. Therefore, specific thicknesses and dimensions should be determined by taking the following description into consideration. In addition, it is needless to say that portions having different dimensional relationships and ratios between the figures are included in the figures.

It is to be understood that definitions of directions such as upward, downward, and the like in the following description are merely definitions provided for convenience of explanation and are not intended as limiting technical ideas of the present disclosure. For example, it is obvious that when an object is observed after being rotated 90°, upward and downward directions are interpreted as being converted into leftward and rightward directions, and when an object is observed after being rotated 180°, upward and downward directions are interpreted as being inverted.

In the following description, for example, in a P type semiconductor, + may be added to a conductive type for description. The P type semiconductor with + added means that a P type impurity concentration is relatively higher than that of a P type semiconductor without +. However, when semiconductors have the same P and P, it does not mean that impurity concentrations of the respective semiconductors are exactly the same.

First Embodiment (Overall Configuration)

FIG. 1 is a schematic diagram showing a configuration example of an imaging device 100 according to a first embodiment of the present disclosure. The imaging device 100 includes, for example, a first substrate unit 110, a second substrate unit 120, and a third substrate unit 130. The imaging device 100 is an imaging device having a three-dimensional structure configured by bonding the first substrate unit 110, the second substrate unit 120, and the third substrate unit 130. The first substrate unit 110, the second substrate unit 120, and the third substrate unit 130 are laminated in order.

The first substrate unit 110 has a semiconductor substrate 111, and a plurality of sensor pixels 112 provided on the semiconductor substrate 111. The plurality of sensor pixels 112 perform photoelectric conversion. The plurality of sensor pixels 112 are provided in a matrix shape in a pixel region 113 of the first substrate unit 110. The second substrate unit 120 has a semiconductor substrate 121, a read circuit 122 provided on the semiconductor substrate 121, a plurality of pixel drive lines 123 provided on the semiconductor substrate 121 to extend in a row direction, and a plurality of vertical signal lines 124 provided on the semiconductor substrate 121 to extend in a column direction. The read circuit 122 outputs pixel signals based on electric charges output from the sensor pixels 112. One read circuit 122 is provided for every four sensor pixels 112.

The third substrate unit 130 has a semiconductor substrate 131, and a logic circuit 132 provided on the semiconductor substrate 131. The logic circuit 132 has a function of processing the pixel signals and has, for example, a vertical drive circuit 133, a column signal processing circuit 134, a horizontal drive circuit 135, and a system control circuit 136.

The vertical drive circuit 133 selects, for example, the plurality of sensor pixels 112 row by row in order. The column signal processing circuit 134 performs correlated double sampling (CDS) processing on the pixel signal output from each sensor pixel 112 in a row selected by the vertical drive circuit 133, for example. The column signal processing circuit 134 extracts a signal level of the pixel signal by performing the CDS processing, for example, and holds pixel data corresponding to an amount of light received by each sensor pixel 112. The horizontal drive circuit 135, for example, sequentially outputs the pixel data held in the column signal processing circuit 134 to the outside. The system control circuit 136 controls, for example, drive of each block (the vertical drive circuit 133, the column signal processing circuit 134, and the horizontal drive circuit 135) in the logic circuit 132.

Figure 3:
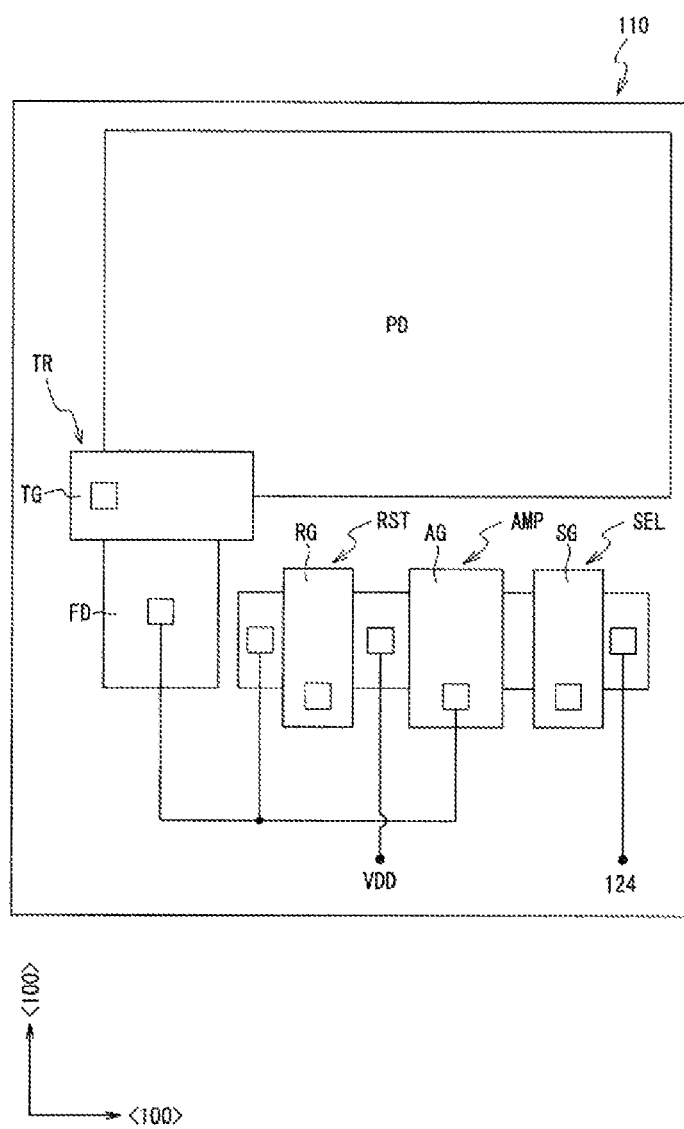
FIG. 3 is a plan view schematically showing a first arrangement example of a reset transistor, an amplification transistor, and a selection transistor in the imaging device according to the first embodiment of the present disclosure.
Figure 4:
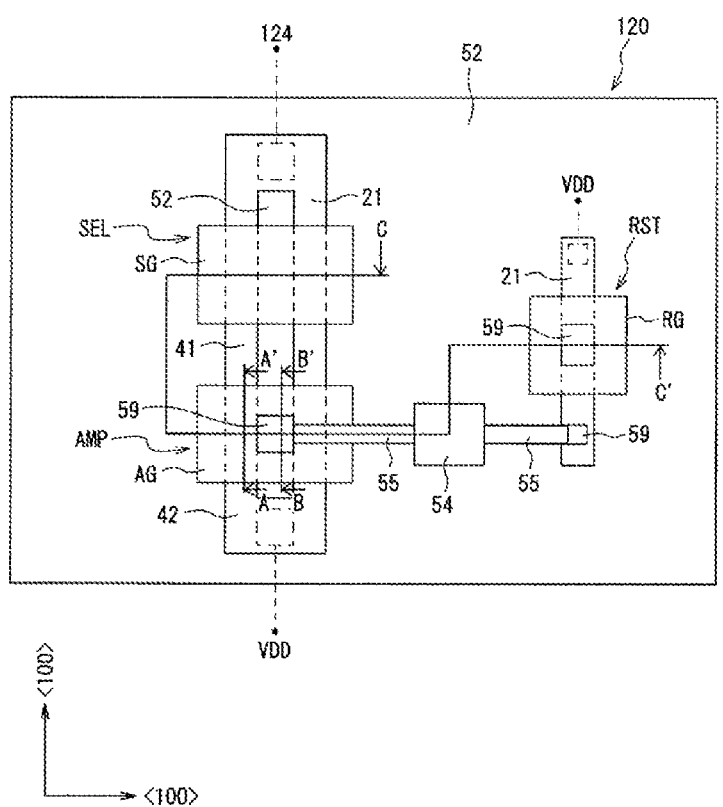
FIG. 4 is a plan view schematically showing a second arrangement example of the reset transistor, the amplification transistor, and the selection transistor in the imaging device according to the first embodiment of the present disclosure.
Figure 17:
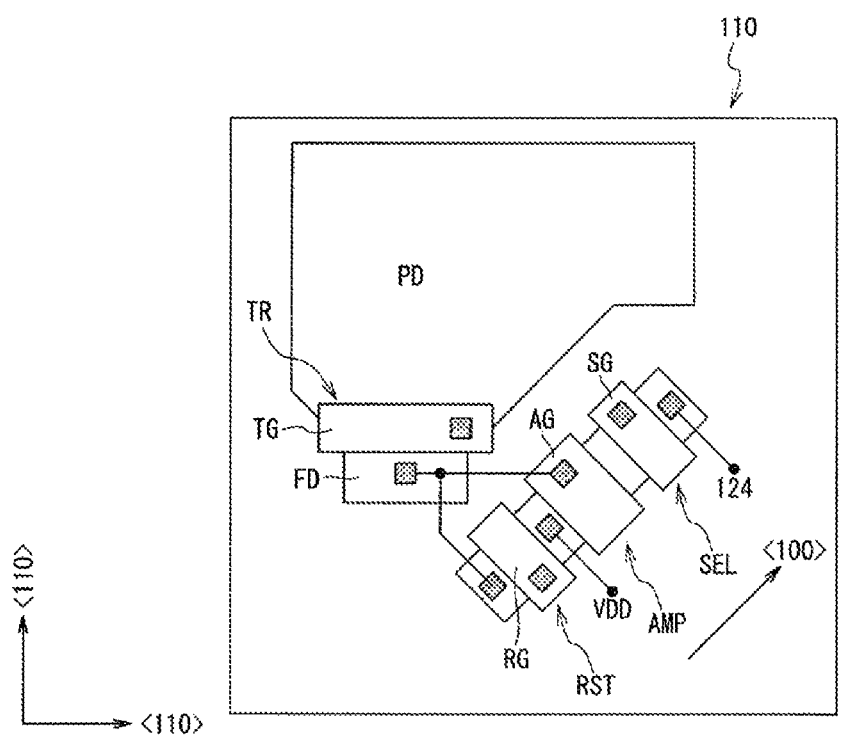
FIG. 17 is a plan view schematically showing an arrangement example of a reset transistor, an amplification transistor, and a selection transistor in an imaging device according to a second embodiment of the present disclosure.

Also, although FIG. 1 shows a case in which the first substrate unit 110 and the second substrate unit 120 are configured of separate substrates, this is only an example. The first substrate unit 110 and the second substrate unit 120 may be configured of one substrate. For example, the first substrate unit 110 may be provided with the plurality of sensor pixels 112 and the read circuit 122. FIGS. 3 and 17, which will be described later, exemplify a case in which the plurality of sensor pixels 112 and the read circuit 122 (including an amplification transistor AMP, a reset transistor RST, and a selection transistor SEL) are provided on the first substrate unit 110. FIG. 4, which will be described later, exemplifies a case in which the sensor pixels 112 are provided on the first substrate unit 110 and the read circuit 122 is provided on the second substrate unit 120.

Figure 2:
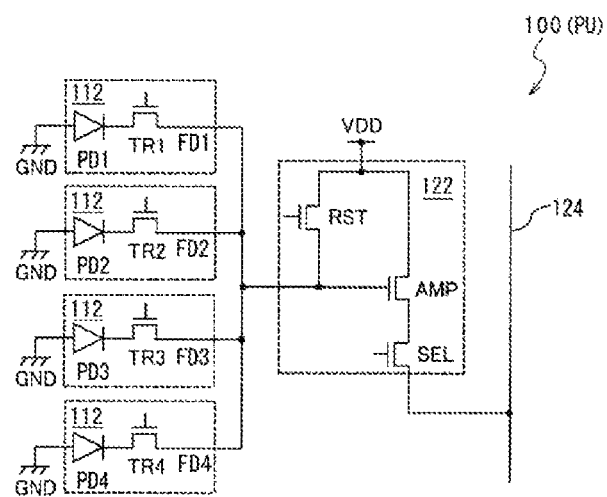
FIG. 2 is a circuit diagram showing a configuration example of a pixel unit according to the first embodiment of the present disclosure.

FIG. 2 is a circuit diagram showing a configuration example of a pixel unit PU according to the first embodiment of the present disclosure. As shown in FIG. 2, in the imaging device 100, four sensor pixels 112 are electrically connected to one read circuit 122 to form one pixel unit PU. The four sensor pixels 112 share one read circuit 122, and each output of the four sensor pixels 112 is input to the shared read circuit 122.

Each sensor pixel 112 has constituent elements common to each other. In FIG. 2, in order to distinguish the constituent elements of each sensor pixel 112 from each other, an identification number 1, 2, 3, or 4 is added to ends of reference numerals (for example, PD, TG, and FD, which will be described later) of the constituent elements of each sensor pixel 112. In cases below in which it is not necessary to distinguish the constituent elements of each sensor pixel 112 from each other, the identification numbers at the ends of the reference numerals of the constituent elements of each sensor pixel 112 will be omitted.

Each sensor pixel 112 has, for example, a photodiode PD (an example of the "light receiving element" of the present disclosure), a transfer transistor TR electrically connected to the photodiode PD, and a floating diffusion FD that temporarily holds an electric charge output from the photodiode PD via the transfer transistor TR. The transfer transistor TR is an N type field effect transistor. The floating diffusion FD is an N type impurity diffusion layer.

The photodiode PD performs photoelectric conversion to generate the electric charge (an electrical signal) in accordance with an amount of received light. A cathode of the photodiode PD is electrically connected to a source of the transfer transistor TR, and an anode of the photodiode PD is electrically connected to a reference potential line (for example, a ground). A drain of the transfer transistor TR is electrically connected to the floating diffusion FD, and a gate electrode of the transfer transistor TR is electrically connected to the pixel drive line 123. The transfer transistor TR is, for example, a complementary metal oxide semiconductor (CMOS) transistor. The gate electrode of the transfer transistor TR is called a transfer gate TG.

The floating diffusions FD of each of the sensor pixels 112 that share one read circuit 122 are electrically connected to each other and are also electrically connected to an input end of the common read circuit 122. The read circuit 122 includes, for example, the amplification transistor AMP, the reset transistor RST, and the selection transistor SEL. The amplification transistor AMP, the reset transistor RST, and the selection transistor SEL are N type field effect transistors. Also, the selection transistor SEL may be omitted if necessary.

A source of the reset transistor RST (the input end of the read circuit 122) is electrically connected to the floating diffusions FD, and a drain of the reset transistor RST is electrically connected to a drain of the amplification transistor AMP and a power supply line VDD. A gate electrode of the reset transistor RST is electrically connected to the pixel drive line 123 (see FIG. 1). A source of the amplification transistor AMP is electrically connected to a drain of the selection transistor SEL, and a gate electrode of the amplification transistor AMP is electrically connected to the source of the reset transistor RST. A source of the selection transistor SEL (an output end of the read circuit 122) is electrically connected to the vertical signal line 124, and a gate electrode of the selection transistor SEL is electrically connected to the pixel drive line 123 (see FIG. 1).

Due to the above connection relationship, the transfer transistor TR switches the connection between the photodiode PD and the floating diffusion FD on or off. The amplification transistor AMP amplifies the electrical signal temporarily stored in the floating diffusion FD. The selection transistor SEL switches the connection between the amplification transistor AMP and the vertical signal line 124 on or off. The reset transistor RST switches the connection between the floating diffusion FD and the power supply line VDD on or off.

When the transfer transistor TR is turned on, the transfer transistor TR transfers the electrical charge of the photodiode PD to the floating diffusion FD. The reset transistor RST resets the potential of the floating diffusion FD to a predetermined potential. When the reset transistor RST is turned on, the potential of the floating diffusion FD is reset to the potential of the power supply line VDD. The selection transistor SEL controls an output timing of the pixel signal (electric signal) from the read circuit 122.

The amplification transistor AMP generates a voltage signal serving as the pixel signal in accordance with a level of the electric charge held in the floating diffusion FD. The amplification transistor AMP constitutes a source follower type amplifier and outputs the pixel signal having a voltage corresponding to the level of electric charge generated by the photodiode PD. When the selection transistor SEL is turned on, the amplification transistor AMP amplifies the potential of the floating diffusion FD and outputs a voltage corresponding to the potential to the column signal processing circuit 134 via the vertical signal line 124.

(Arrangement and Configuration of Field Effect Transistors)

FIG. 3 is a plan view schematically showing a first arrangement example of the reset transistor RST, the amplification transistor AMP, and the selection transistor SEL in the imaging device 100 according to the first embodiment of the present disclosure, As described above, in the example shown in FIG. 3, the photodiode PD, the transfer transistor TR, the reset transistor RST, the amplification transistor AMP, and the selection transistor SEL are provided on the first substrate unit 110.

A main surface (for example, an upper surface) of the semiconductor substrate 111 (see FIG. 1) constituting the first substrate unit 110 has a crystal plane that is a (100) plane or a plane equivalent to the (100) plane. Also, as the plane equivalent to the (100) plane, a (010) plane, a (001) plane, a (−100) plane, a (0-10) plane, and a (00-1) plane can be mentioned. In the present specification, for convenience of explanation, the plane equivalent to the (100) plane may be simply referred to as the (100) plane. In addition, a normal direction of the crystal plane is a crystal orientation. The crystal orientation of the (100) plane is a <100> direction. In the present specification, for convenience of explanation, not only the crystal orientation of the (100) plane but also a crystal orientation of the plane equivalent to the (100) plane is simply referred to as the <100> direction.

As shown in FIG. 3, in the first substrate unit 110, the transfer transistor TR is disposed such that a gate length direction thereof is parallel to the <100> direction. The gate length direction is a direction from a source to a drain of a field effect transistor. Similarly, the reset transistor RST, the amplification transistor AMP, and the selection transistor SEL are also disposed such that their gate length directions are parallel to the <100> direction.

In the embodiment of the present disclosure, in at least the amplification transistor AMP among the reset transistor RST, the amplification transistor AMP, and the selection transistor SEL, a shape of a semiconductor layer in which a channel is formed is a fin shape. Not only in the amplification transistor AMP but also in the reset transistor RST and the selection transistor SEL, a shape of a semiconductor layer in which a channel is formed may be a fin shape.

FIG. 4 is a plan view schematically showing a second arrangement example of the reset transistor RST, the amplification transistor AMP, and the selection transistor SEL in the imaging device 100 according to the first embodiment of the present disclosure. As described above, in the example shown in FIG. 4, the reset transistor RST, the amplification transistor AMP, and the selection transistor SEL are provided in the second substrate unit 120. In FIG. 4, in order to illustrate gate electrodes RG, AG, and SG of the reset transistor RST, the amplification transistor AMP, and the selection transistor SEL, and semiconductor layers 21, Illustration of an interlayer insulating film 57 (see FIG. 7) is omitted.

Figure 5:
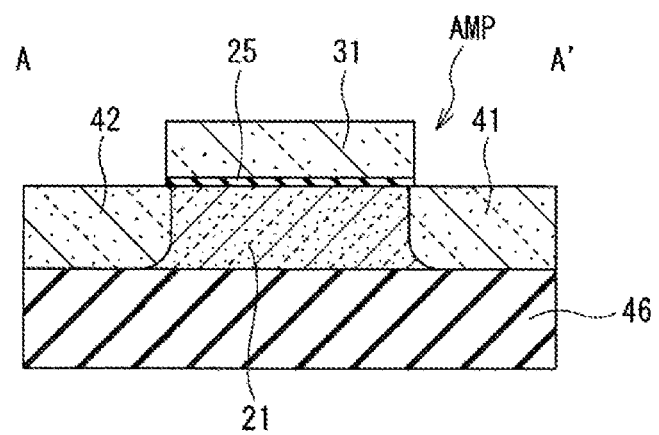
FIG. 5 is a cross-sectional view showing a configuration example of the amplification transistor according to the first embodiment of the present disclosure.
Figure 6:
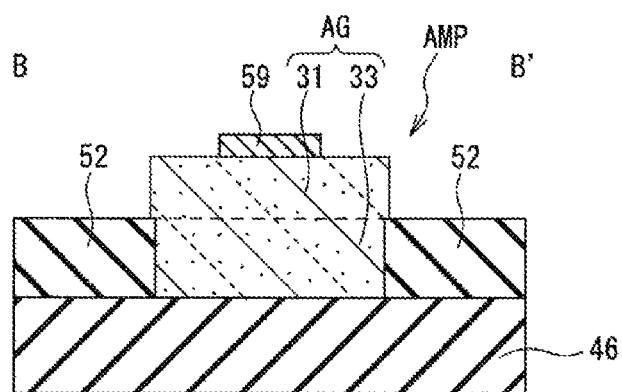
FIG. 6 is a cross-sectional view showing a configuration example of the amplification transistor according to the first embodiment of the present disclosure.
Figure 7:
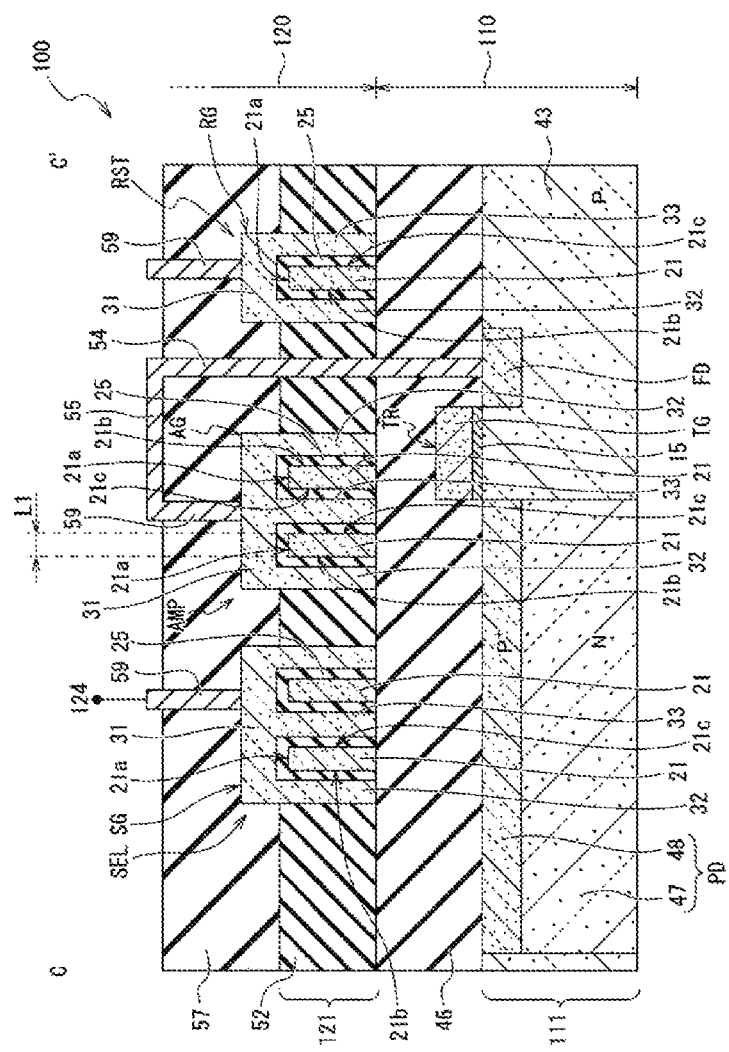
FIG. 7 is a cross-sectional view showing a configuration example of the imaging device according to the first embodiment of the present disclosure.

FIGS. 5 and 6 are cross-sectional views showing a configuration example of the amplification transistor AMP according to the first embodiment of the present disclosure. FIG. 5 shows a cross-section of the plan view shown in FIG. 4 along line A-A'. FIG. 6 shows a cross-section of the plan view shown in FIG. 4 along line B-B'. FIG. 7 is a cross-sectional view showing a configuration example of the imaging device 100 according to the first embodiment of the present disclosure. FIG. 7 shows a cross-section of the plan view shown in FIG. 4 along line C-C' and shows a cross-section of a laminate including the first substrate unit 110 and the second substrate unit 120.

As shown in FIG. 4, the second substrate unit 120 is provided with the reset transistor RST, the amplification transistor AMP, and the selection transistor SEL. As shown in FIGS. 4 to 7, the amplification transistor AMP has a P type semiconductor layer 21 in which a channel is formed, a gate electrode AG that covers the semiconductor layer 21, and a gate insulating film 25 disposed between the semiconductor layer 21 and the gate electrode AG.

A main surface (for example, an upper surface) of the semiconductor substrate 121 (see FIG. 1) constituting the second substrate unit 120 has a crystal plane that is a (100) plane or a plane equivalent to the (100) plane. The semiconductor layer 21 is, for example, a part of the semiconductor substrate 121 and is made of single crystal silicon. The semiconductor layer 21 is a portion formed by etching a part of an upper surface 21a side of the semiconductor substrate 121. A shape of the semiconductor layer 21 is, for example, a fin shape. The fin shape is, for example, a rectangular parallelepiped shape that is long in its gate length direction and short in its gate width direction orthogonal to the gate length direction. A length (width) L1 of the semiconductor layer 21 in the gate width direction is preferably 300 nm or less. Thus, a fin confinement effect can be obtained. The fin confinement effect is an effect that a semiconductor layer serving as a channel is surrounded with a gate electrode, whereby a current flows in a portion separated from an interface between the semiconductor layer and a gate oxide film.

The semiconductor layer 21 has the upper surface 21a (an example of the "main surface" of the present disclosure), a first side surface 21b, and a second side surface 21c. In the gate width direction of the amplification transistor AMP, the first side surface 21b is located on one end side of the upper surface 21a, and the second side surface 21c is located on one end side of the upper surface 21a. A crystal plane of each of the upper surface 21a, the first side surface 21b, and the second side surface 21c is a (100) plane, and a crystal orientation thereof, which is a normal direction of the crystal plane, is the <100> direction.

The amplification transistor AMP has a plurality of fin-shaped semiconductor layers 21. The plurality of semiconductor layers 21 are disposed side by side at intervals in the gate width direction of the amplification transistor AMP.

The gate insulating film 25 is provided to cover the upper surface 21a, the first side surface 21b, and the second side surface 2121c of the semiconductor layer 21. The gate insulating film 20 is made of, for example, a silicon oxide film ($SiO_2$ film).

The gate electrode AG covers the semiconductor layer 21 via the gate insulating film 25. For example, the gate electrode AG has a first portion 31 that faces the upper surface 21a of the semiconductor layer 21 via the gate insulating film 25, a second portion 32 that faces the first side surface 21b of the semiconductor layer 21 via the gate insulating film 25, and a third portion 33 that faces the second side surface 21c of the semiconductor layer 21 via the gate insulating film 25. The second portion 32 and the third portion 33 are connected to a lower surface of the first portion 31.

Thus, the gate electrode AG can simultaneously apply a gate voltage to the upper surface 21a, the first side surface 21b, and the second side surface 21c of the semiconductor layer 21. That is, the gate electrode 30 can simultaneously apply the gate voltage to the semiconductor layer 21 from a total of three directions, an upper side, and both left and right sides. Thus, the gate electrode 30 can completely deplete the semiconductor layer 21. The gate electrode 30 is made of, for example, a polysilicon (Poly-Si) film.

A source region 41 and a drain region 42 are provided in regions of the semiconductor substrate 121 which are exposed from below the gate electrode AG. In the gate length direction of the amplification transistor AMP, the source region 41 is connected to one side of the semiconductor layer 21 in which the channel is formed, and the drain region 42 is connected to the other side of the semiconductor layer 21 in which the channel is formed. Conductive types of the source region 41 and the drain region 42 are, for example, N types.

The selection transistor SEL and the reset transistor RST have the same configuration as the amplification transistor AMP. That is, the selection transistor SEL has a fin-shaped semiconductor layer 21, a gate insulating film 25, and a gate electrode SG. The semiconductor layer 21 has an upper surface 21a, a first side surface 21b, and a second side surface 21c. Also in the selection transistor SEL, a crystal plane of each of the upper surface 21a, the first side surface 21b, and the second side surface 21c of the semiconductor layer 21 is a (100) plane, and a crystal orientation thereof is the <100> direction. The selection transistor SEL has a plurality of fin-shaped semiconductor layers 21. The plurality of semiconductor layers 21 are disposed side by side at intervals in the gate width direction of the selection transistor SEL. The gate electrode SG covers the upper surface 21a, the first side surface 21b, and the second side surface 21c of the plurality of semiconductor layers 21 via the gate insulating film 25.

The reset transistor RST has a fin-shaped semiconductor layer 21, a gate insulating film 25, and a gate electrode RG. The semiconductor layer 21 has an upper surface 21a, a first side surface 21b, and a second side surface 21c. Also in the reset transistor RST, a crystal plane of each of the upper surface 21a, the first side surface 21b, and the second side surface 21c of the semiconductor layer 21 is a (100) plane, and a crystal orientation thereof is the <100> direction. The selection transistor SEL has one fin-shaped semiconductor layer 21. The gate electrode RG covers the upper surface 21a, the first side surface 21b, and the second side surface 21c of one semiconductor layer 21 via the gate insulating film 25.

As shown in FIG. 7, in the second substrate unit 120, the gate electrode AG of the amplification transistor AMP, the gate electrode SG of the selection transistor SEL, and the gate electrode RG of the reset transistor RST are separated from each other by an insulating film 52 and covered with the interlayer insulating film 57. The insulating film 52 for element separation is configured of, for example, a silicon oxide film ($SiO_2$ film). The interlayer insulating film 57 is configured of, for example, a $SiO_2$ film, a silicon nitride film (SiN film), or a film in which these are laminated.

The interlayer insulating film 57 is provided with a plurality of through holes. Through wirings 54 and 59 are provided in these through holes. Further, a wiring 55 is provided on the interlayer insulating film 57. The gate electrode AG of the amplification transistor AMP is connected to the source of the reset transistor RST and the floating diffusion FD of the first substrate unit 110 via the through wirings 54 and 59 and the wiring 55.

As shown in FIG. 7, the semiconductor substrate 111 of the first substrate unit 110 is provided with the photodiode PD, a P-well region 43 in which the channel of the transfer transistor TR is formed, and the floating diffusion FD corresponding to the drain of the transfer transistor TR. The photodiode PD is configured of an N type impurity diffusion layer 47, and a $P^+$ type impurity diffusion layer 48 provided on the N type impurity diffusion layer 47. The N type impurity diffusion layer 47 and the $P^+$ type impurity diffusion layer 48 are joined by PN junction. The floating diffusion FD is an N type impurity diffusion layer. Further, the transfer gate TG, which is a gate electrode of the transfer transistor TR, is provided on the semiconductor substrate 111 via a gate insulating film 15. The transfer gate TG is covered with an interlayer insulating film 46 provided on the semiconductor substrate 111.

Although not shown in FIG. 7, the third substrate unit 130 is disposed on the second substrate unit 120. Further, in the first substrate unit 110, a color filter and a light receiving lens are disposed on a side opposite to a surface provided with the interlayer insulating film 46.

(Positional Relationship between Field Effect Transistor and Notch)

Figure 8:
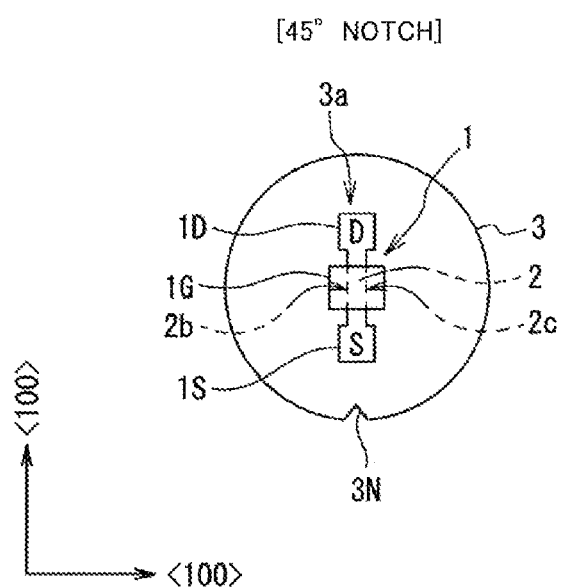
FIG. 8 is a plan view schematically showing a positional relationship between a field effect transistor and a notch in a case in which a 45° notch substrate is used in an embodiment of the present disclosure.

FIG. 8 is a plan view schematically showing a positional relationship between a field effect transistor 1 and a notch 3N in a case in which a 45° notch substrate is used in the embodiment of the present disclosure. As shown in FIG. 8, the field effect transistor 1 has a source 1S, a drain 1D, and a gate electrode 1G. A fin-shaped semiconductor layer 2 is disposed under the gate electrode 1G.

A semiconductor wafer 3 is, for example, a single crystal silicon wafer. A crystal plane of an upper surface 3a of the semiconductor wafer 3 (that is, a surface on which the field effect transistor 1 is formed) is a (100) plane. In addition, the semiconductor wafer 3 is provided with the notch 3N in the <100> direction. Regarding a crystal orientation thereof, the <100> direction is tilted by 45° with respect to a <110> direction. In the present specification, the semiconductor wafer 3 provided with the notch 3N in the <100> direction is also referred to as a 45° notch substrate.

In the 45° notch substrate, each of a notching direction of the notch 3N and a direction orthogonal to the notching direction is the <100> direction. Thus, as shown in FIG. 8, crystal planes of the first side surface 2b and the second side surface 2c located at both ends of the semiconductor layer 2 in the gate width direction are (100) planes.

In the embodiment of the present disclosure, the semiconductor substrate 121 of the second substrate unit 120 corresponds to the semiconductor wafer 3 shown in FIG. 8. The amplification transistor AMP corresponds to the field effect transistor 1 shown in FIG. 8. Further, in addition to the amplification transistor AMP, one or more of the reset transistor RST, the amplification transistor AMP, and the selection transistor SEL may correspond to the field effect transistor 1.

(Manufacturing Method)

Next, a method for manufacturing the imaging device 100 shown in FIG. 7 will be described. The imaging device 100 is manufactured by using various devices such as a film forming device (including a chemical vapor deposition (CVD) device and a sputtering device), an ion implantation device, a heat treatment device, an etching device, a chemical mechanical polishing (CMP) device, and a bonding device. Hereinafter, these devices are collectively referred to as a manufacturing device.

Figure 9:
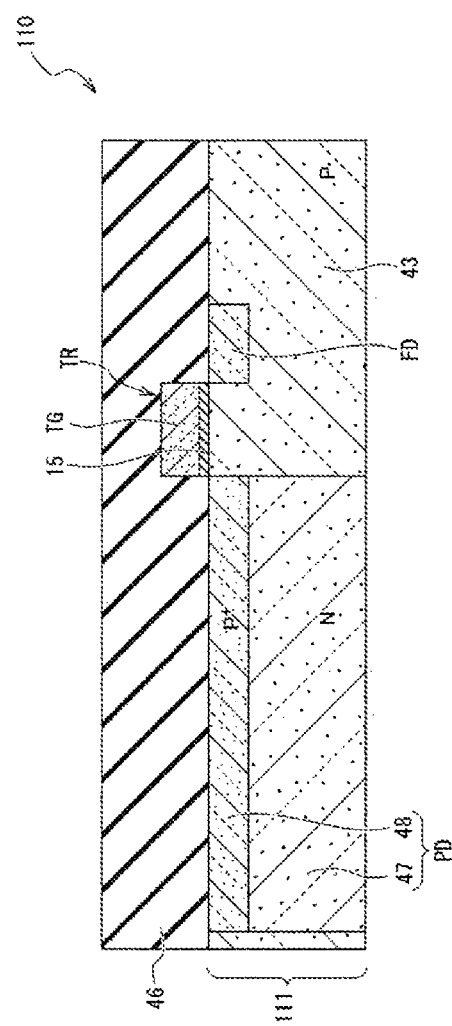
FIG. 9 is a cross-sectional view showing a method for manufacturing the imaging device according to the first embodiment of the present disclosure in the order of processes.

FIGS. 9 to 14 are cross-sectional views showing the method for manufacturing the imaging device 100 according to the first embodiment of the present disclosure in the order of processes. As shown in FIG. 9, the manufacturing device forms the P-well region 43 on the semiconductor substrate 111. Any substrate can be used for the semiconductor substrate 111. As an example, for the semiconductor substrate 111, a 45° notch substrate whose main surface is the (100) plane is used.

Next, the manufacturing device forms the gate insulating film 15 on the P-well region 43 and forms the transfer gate TG on the gate insulating film 15. Next, the manufacturing device forms the floating diffusion FD and the photodiode PD configured of the N type impurity diffusion layer 47 and the P+ type impurity diffusion layer 48 on the semiconductor substrate 111. In a process of forming the floating diffusion FD and a process of forming the photodiode PD, the manufacturing device may use the transfer gate TG as a part of a mask for ion implantation. Next, the manufacturing device forms the interlayer insulating film 46 on the semiconductor substrate 111. Through the above processes, the first substrate unit 110 is manufactured.

Figure 10:
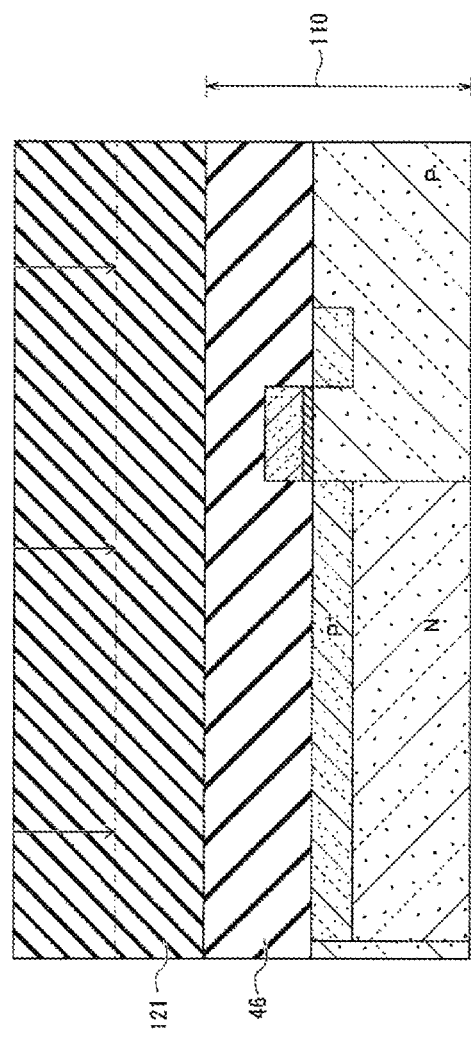
FIG. 10 is a cross-sectional view showing the method for manufacturing the imaging device according to the first embodiment of the present disclosure in the order of processes.

Next, as shown in FIG. 10, the manufacturing device bonds the semiconductor substrate 121 on the interlayer insulating film 46 of the first substrate unit 110. For the semiconductor substrate 121, a 45° notch substrate whose main surface is the (100) plane is used. Next, the manufacturing device polishes or etches the upper surface of the semiconductor substrate 121 to form the semiconductor substrate 121 to a preset thickness. By using the (100)

substrate for the semiconductor substrate 121, the upper surface 21*a* of the semiconductor layer 21 becomes the (100) plane.

Figure 11:
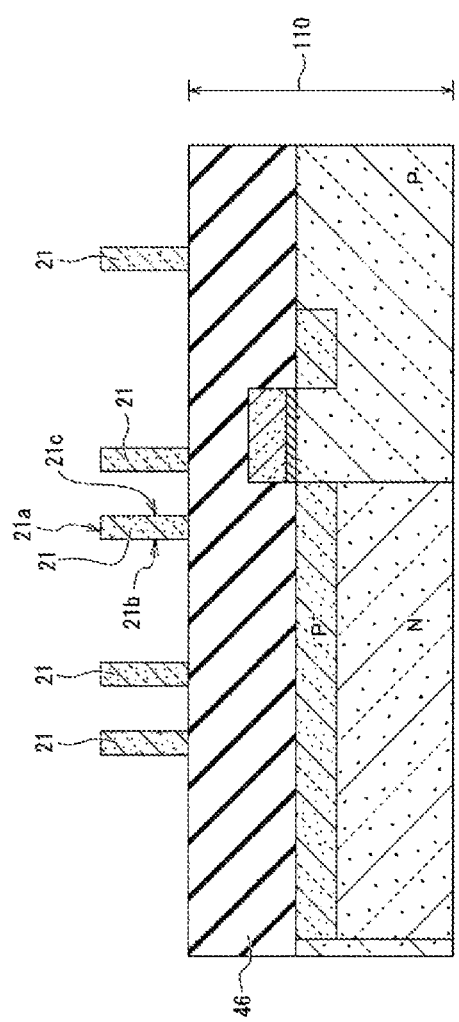
FIG. 11 is a cross-sectional view showing the method for manufacturing the imaging device according to the first embodiment of the present disclosure in the order of processes.

Next, as shown in FIG. 11, the manufacturing device etches the semiconductor substrate 121 to form the fin-shaped semiconductor layer 21. In this etching process, the semiconductor substrate 121 is etched with a mask (for example, a resist pattern or a hard mask) disposed on the semiconductor substrate 121. In a process of disposing the mask, a position of the notch is adjusted in advance such that the notching direction of the notch (for example, the <100> direction as shown in FIG. 7) is parallel or perpendicular to the gate length direction of the semiconductor layer 21 formed by using the mask. Thus, the first side surface 21*b* and the second side surface 21*c* of the semiconductor layer 21 formed by using the mask become the (100) plane.

Figure 12:
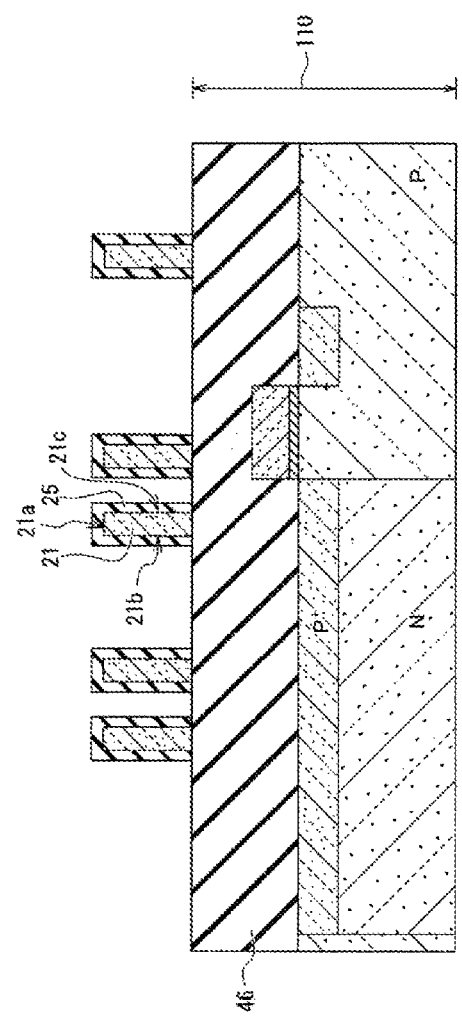
FIG. 12 is a cross-sectional view showing the method for manufacturing the imaging device according to the first embodiment of the present disclosure in the order of processes.

Next, the manufacturing device thermally oxidizes the semiconductor layer 21. Thus, as shown in FIG. 12, the manufacturing device forms the gate insulating film 25 on the upper surface 21*a*, the first side surface 21*b*, and the second side surface 21*c* of the semiconductor layer 21.

Figure 13:
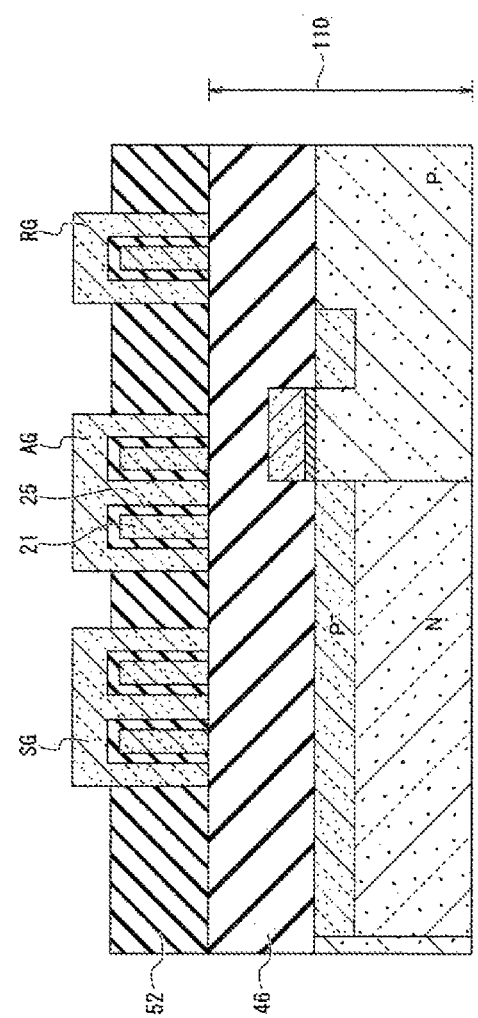
FIG. 13 is a cross-sectional view showing the method for manufacturing the imaging device according to the first embodiment of the present disclosure in the order of processes.

Next, the manufacturing device uses the CVD method to form a polysilicon film on the interlayer insulating film 46. The manufacturing device forms, for example, a polysilicon film doped with P-type impurities. Next, the manufacturing device etches the polysilicon film to form the gate electrodes SG, AG, and RG as shown in FIG. 13. Conductive types of the gate electrodes SG, AG, and RG are, for example, $P^+$ types.

Next, the manufacturing device performs ion implantation of N type impurities into the semiconductor layer 21 using the gate electrodes SG, AG, and RG as masks. Next, the manufacturing device performs heat treatment for the semiconductor layer 21 in which the N type impurities are ion-implanted. This forms the source region and drain region of the selection transistor SEL, the source region 41 (see FIG. 5) and the drain region 42 (see FIG. 5) of the amplification transistor AMP, and the source region and the drain region of the reset transistor RST.

Figure 14:
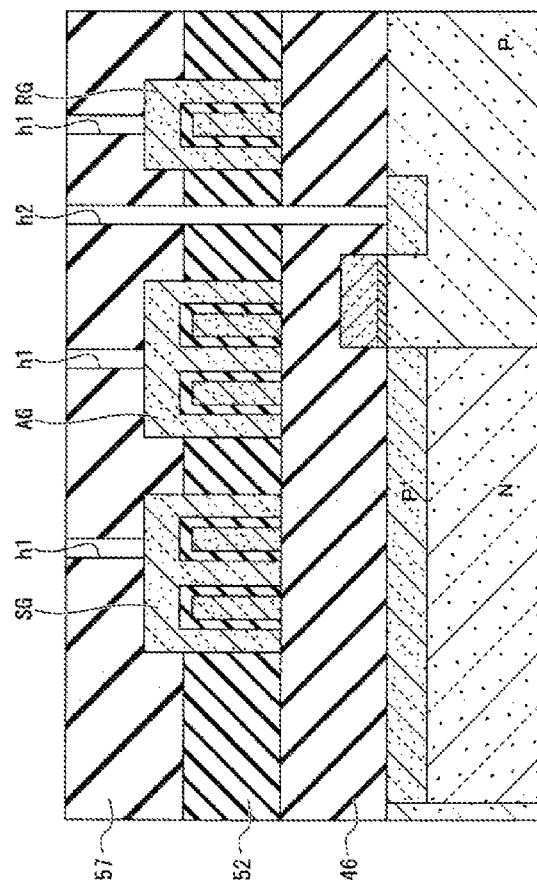
FIG. 14 is a cross-sectional view showing the method for manufacturing the imaging device according to the first embodiment of the present disclosure in the order of processes.

Next, the manufacturing device uses the CVD method to form the insulating film 52 for element separation on the interlayer insulating film 46. Next, the manufacturing device flattens the insulating film 52 by etching back or performing CMP processing on the insulating film 52. Next, as shown in FIG. 14, the manufacturing device uses the CVD method to form the interlayer insulating film 57 on the insulating film 52 and on the gate electrodes SG, AG, and RG.

Next, the manufacturing device etches the interlayer insulating film 57 to form through holes h1 on the gate electrodes SG, AG, and RG. Further, the manufacturing device etches the interlayer insulating film 57, the insulating film 52 for element separation, and the interlayer insulating film 46 to form a through hole h2 on the floating diffusion FD. The through holes h1 and h2 may be formed at the same time or separately.

Next, the manufacturing device forms the through wiring 59 (see FIG. 7) in the through holes h1 and the through wiring 54 (see FIG. 7) in the through hole h2. Further, the manufacturing device forms the wiring 55 (see FIG. 7) on the interlayer insulating film 46. The through wirings 54 and 59 and the wiring 55 may be formed at the same time or separately. Through the above processes, the imaging device 100 shown in FIG. 7 is completed.

As described above, the imaging device 100 according to the first embodiment of the present disclosure includes the photodiode PD, and the read circuit 122 for reading the electrical signal photoelectrically converted by the photodiode PD. The field effect transistor (for example, the amplification transistor AMP) included in the read circuit 122 has the semiconductor layer 21 in which the channel is formed, the gate electrode AG that covers the semiconductor layer 21, and the gate insulating film 25 disposed between the semiconductor layer 21 and the gate electrode AG. The semiconductor layer 21 has the upper surface 21*a*, and the first side surface 21*b* located on one end side of the upper surface 21*a* in the gate width direction of the amplification transistor AMP. The gate electrode AG has the first portion 31 that faces the upper surface 21*a* via the gate insulating film 25, and the second portion 32 that faces the first side surface 21*b* via the gate insulating film 25. The crystal plane of the first side surface 21*b* is the (100) plane or a plane equivalent to the (100) plane.

According to this, the amplification transistor AMP included in the read circuit 122 can reduce an interface state of the first side surface 21*b* on which the channel is formed, and can reduce the electric charge (for example, electrons) trapped in the interface state. Thus, the imaging device 100 can reduce noise (for example, 1/f noise) caused by the above-mentioned interface state. Further, since the imaging device 100 can reduce noise, it is possible to shorten a gate length of the amplification transistor AMP. As a result, the imaging device 100 can reduce a pixel size and increase a degree of freedom in layout in the pixel.

Further, the semiconductor layer 21 may further have the second side surface 21*c* located on the other end side of the upper surface 21*a* in the gate width direction. The gate electrode AG may further have the third portion 33 that faces the second side surface 21*c* via the gate insulating film 25. The crystal plane of the second side surface 21*c* may be the (100) plane or a plane equivalent to the (100) plane. According to this, a channel is formed not only on the first side surface 21*b* of the semiconductor layer 21 but also on the second side surface 21*c*. The amplification transistor AMP can widen a gate width and reduce on-resistance. In addition, the amplification transistor AMP can reduce the interface state also on the second side surface 21*c*.

Further, the crystal plane of the upper surface 21*a* of the semiconductor layer 21 may be the (100) plane or a plane equivalent to a (100) plane. According to this, the amplification transistor AMP can also reduce the interface state on the upper surface 21*a*.

Further, in the embodiment of the present disclosure, each crystal plane of the upper surface 21*a*, the first side surface 21*b*, and the second side surface 21*c* of the semiconductor layer 21 may include some manufacturing error (an offset) with respect to the (100) plane. For example, in the process of forming the semiconductor layer 21 shown in FIG. 11, when the semiconductor wafer is set in a state in which it is slightly displaced from a stage of the manufacturing device (for example, an exposure device), manufacturing errors may occur in the crystal planes of the first side surface 21*b* and the second side surface 21*c*. The embodiment of the present disclosure tolerate such manufacturing errors.

For example, in the embodiment of the present disclosure, a crystal plane closer to the (100) plane than an intermediate between the (100) plane and the (110) plane is treated as the (100) plane. In the embodiment of the present disclosure, a crystal plane whose inclination with respect to the (100) plane is less than $\pm 22.5°$ ($=45°\pm 2$) is treated as the (100) plane. It is preferable that each crystal plane of the first side surface 21*b* and the second side surface 21*c* of the semiconductor layer 21 is exactly the (100) plane, but even in a case in which there are manufacturing errors as described above, the imaging device 100 can reduce the interface state of the semiconductor layer 21 in which the channel of the amplification transistor AMP is formed, and can reduce noise (for example, 1/f noise) caused by the interface state.

Modified Example 1

Figure 15:
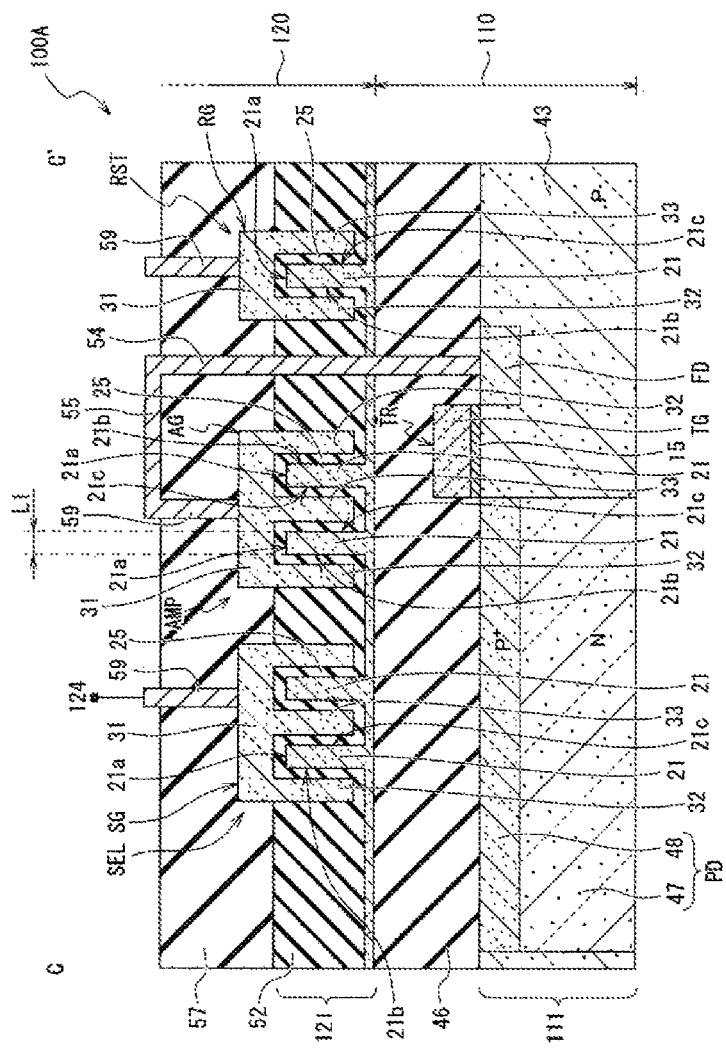
FIG. 15 is a cross-sectional view showing a configuration of an imaging device according to a modified example of the first embodiment of the present disclosure.

FIG. 15 is a cross-sectional view showing a configuration of an imaging device 100A according to a modified example of the first embodiment of the present disclosure. As shown in FIG. 15, in the imaging device 100A, lower portions of the fin-shaped semiconductor layers 21 are connected to each other. This structure can be formed by leaving the semiconductor substrate 121 exposed from the mask thin instead of completely removing it by etching in the process of forming the semiconductor layer 21 shown in FIG. 11. Similarly to the above-mentioned imaging device 100, the imaging device 100A can reduce the interface state of the semiconductor layer 21 in which the channel of the amplification transistor AMP is formed, and can reduce noise (for example, 1/f noise) caused by the interface state.

Modified Example 2

Although FIGS. 7 and 15 show a case in which the amplification transistor AMP has two semiconductor layers 21, the embodiment of the present disclosure is not limited thereto. The number of the semiconductor layers 21 included in the amplification transistor AMP may be one or three or more. In a case in which the number of semiconductor layers 21 included in the amplification transistor AMP is one, the amplification transistor AMP has the same structure as the reset transistor RST shown in FIGS. 7 and 15. In addition, in a case in which the number of semiconductor layers 21 included in the amplification transistor AMP is three or more, the three or more semiconductor layers 21 are disposed side by side at intervals in the gate width direction of the amplification transistor AMP. Similarly to the imaging device 100 described above, the imaging device according to the second modified example can reduce the interface state of the semiconductor layer 21 in which the channel of the amplification transistor AMP is formed, and can reduce noise (for example, 1/f noise) caused by the interface state.

Second Embodiment

In the above embodiment, it has been described that the semiconductor wafers (that is, the 45° notch substrates) in which notches are provided in the <100> direction are used for the semiconductor substrates 111 and 121. However, the embodiment of the present disclosure is not limited thereto. In the embodiment of the present disclosure, semiconductor wafers in which notches are provided in the <110> direction instead of the <100> direction may be used for the semiconductor substrates 111 and 121. In the present specification, a semiconductor wafer provided with a notch in the <110> direction is referred to as a 0° notch substrate.

Figure 16:
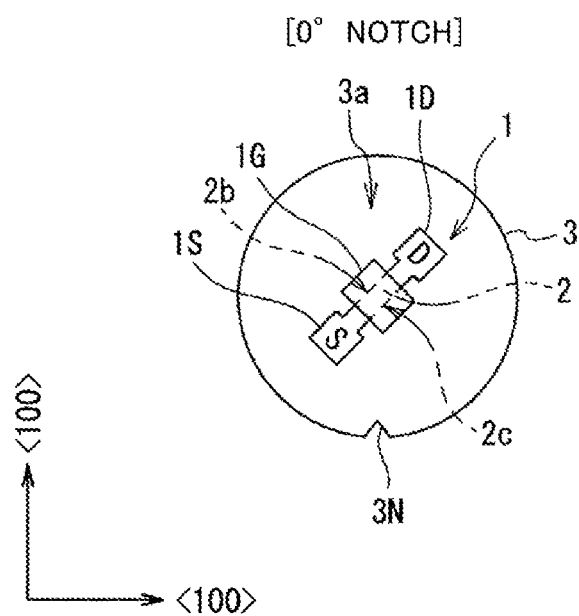
FIG. 16 is a plan view schematically showing a positional relationship between a field effect transistor and a notch in a case in which a 0° notch substrate is used in an embodiment of the present disclosure.

FIG. 16 is a plan view schematically showing a positional relationship between the field effect transistor 1 and the notch 3N in a case in which the 0° notch substrate is used in the embodiment of the present disclosure. In the 0° notch substrate, each of the notching direction of the notch 3N and the direction orthogonal to the notching direction is the <110> direction. As shown in FIG. 16, in a case in which the 0° notch substrate is used, the field effect transistor 1 is formed on the semiconductor wafer 3 such that the direction inclined by 45° with respect to the notching direction of the notch 3N is the gate length direction. Thus, the crystal planes of the first side surface 2b and the second side surface 2c of the semiconductor layer 2 become (100) planes.

FIG. 17 is a plan view schematically showing an arrangement example of the reset transistor RST, the amplification transistor AMP, and the selection transistor SEL in an imaging device 100B according to a second embodiment of the present disclosure. As described above, in the example shown in FIG. 17, the reset transistor RST, the amplification transistor AMP, and the selection transistor SEL are provided on the first substrate unit 110. In the second embodiment, a 0° notch substrate is used for the semiconductor substrate of the first substrate unit 110.

As shown in FIG. 17, in the first substrate unit 110, the transfer transistor TR is formed such that the notching direction of the notch is the gate length direction. Further, in the first substrate unit 110, the reset transistor RST, the amplification transistor AMP, and the selection transistor SEL are formed such that the direction inclined 45 degrees with respect to the notching direction of the notch is the gate length direction.

In such a case, in each of the reset transistor RST, the amplification transistor AMP, and the selection transistor SEL, each crystal plane of the upper surface 21a, the first side surface 21b, and the second side surface 21c of the semiconductor layer 21 is also the (100) plane. Accordingly, similarly to the imaging device 100 according to the first embodiment, the imaging device 100B according to the second embodiment can reduce the interface state of the semiconductor layer 21 in which the channel of the amplification transistor AMP is formed, and can reduce noise (for example, 1/f noise) caused by the interface state.

Also, the gate length direction of the transfer transistor TR is not limited to the above. The gate length direction of the transfer transistor TR may be perpendicular to the notching direction of the notch or may be inclined with respect to the notching direction of the notch. Further, the gate length directions of the reset transistor RST and the selection transistor SEL are not limited to the above. In the second embodiment, when at least the gate length direction of the amplification transistor AMP is inclined by 45° with respect to the notching direction of the notch, the above-mentioned interface state can be reduced, and noise (for example, 1/f noise) caused by the interface state can be reduced.

<Measurement Results of Interface State>

Figure 18:
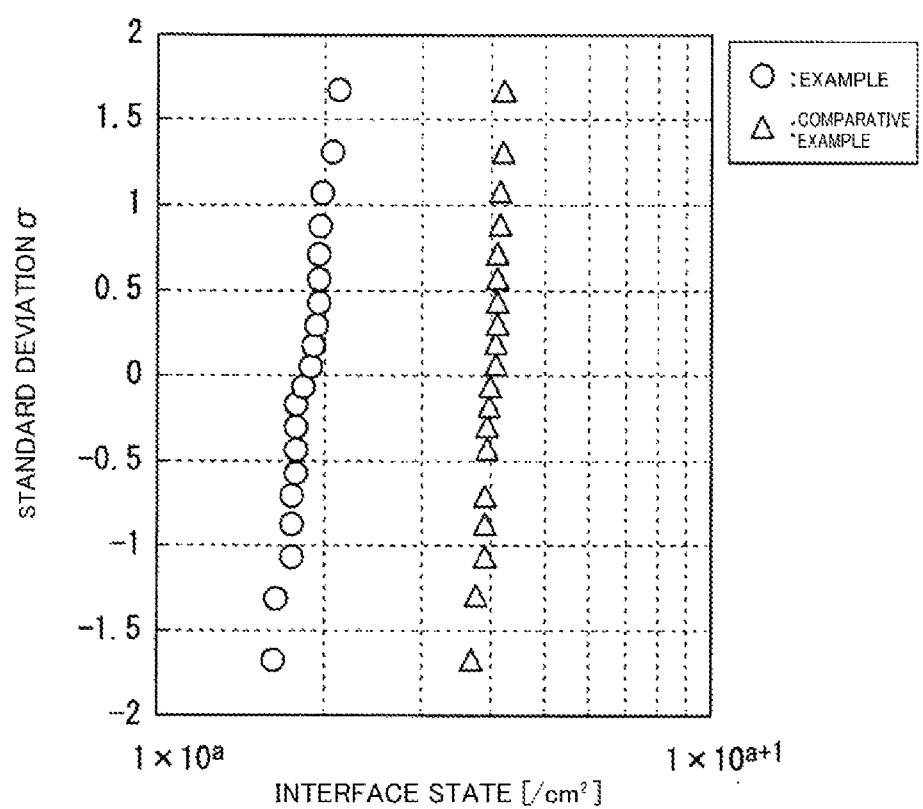
FIG. 18 is a diagram showing measurement results of an interface state of a field effect transistor according to an example of the present disclosure and an interface state of a field effect transistor according to a comparative example.

FIG. 18 is a diagram showing measurement results of an interface state of a field effect transistor according to an example of the present disclosure and an interface state of a field effect transistor according to a comparative example. The horizontal axis in FIG. 18 indicates a magnitude of the interface state. On the horizontal axis, "a" is an integer. In addition, the vertical axis in FIG. 18 shows a standard deviation $\sigma$ of the interface state.

In the field effect transistor according to the example, the first side surface and the second side surface of the semiconductor layer in which the channel is formed are (100) planes. In the field effect transistor according to the comparative example, the first side surface and the second side surface of the semiconductor layer in which the channel is formed are (110) planes. As shown in FIG. 18, it was confirmed that the interface state of the field effect transistor according to the example is about ½ of the interface state of the field effect transistor according to the comparative example.

Specific Examples

The above-mentioned first and second embodiments and the modified examples thereof can be applied to imaging devices having various structures. Examples of imaging devices to which the embodiments of the present disclosure can be applied will be shown below as specific examples.

First Specific Example

Figure 19:
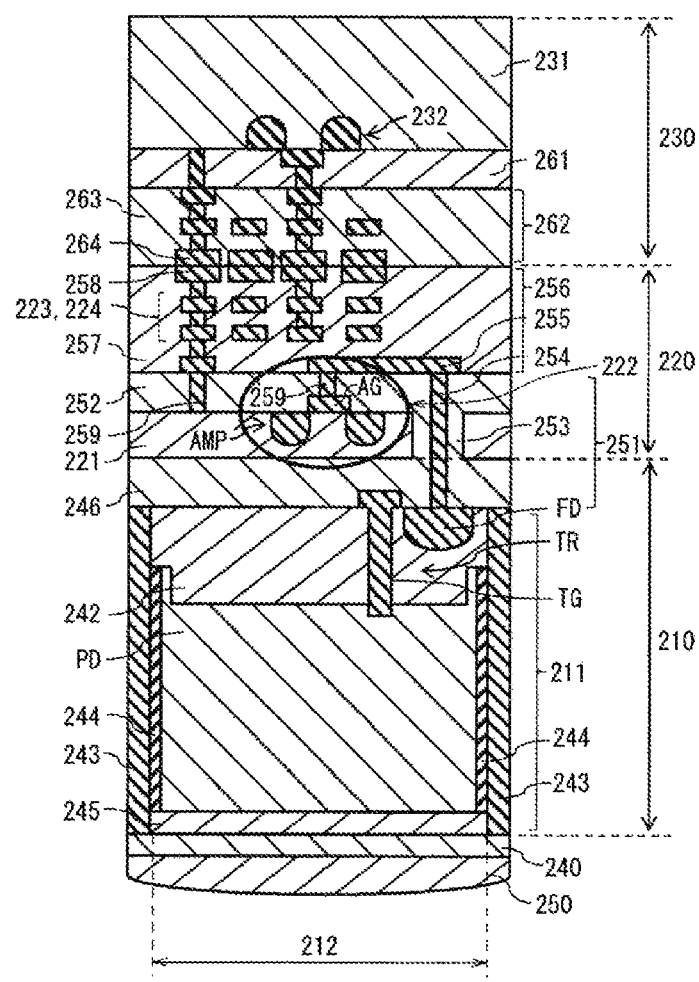
FIG. 19 is a cross-sectional view showing a first specific example of an imaging device according to an embodiment of the present disclosure.

FIG. 19 is a cross-sectional view showing a first specific example of an imaging device according to the embodiments of the present disclosure. As shown in FIG. 19, the imaging device according to the first specific example is configured by laminating a first substrate unit 210, a second substrate 220, and a third substrate 230 in this order, and includes a color filter 240, and a light receiving lens 250 on a back surface side (a light incidence surface side) of the first substrate unit 210. One color filter 240 and one light receiving lens 250 are provided for each sensor pixel 212. The imaging device shown in FIG. 19 is a back side illumination type imaging device.

The first substrate unit 210 is configured by laminating an insulating layer 246 on a semiconductor substrate 211. The first substrate unit 210 has the insulating layer 246 as a part of an interlayer insulating film 251. The insulating layer 246 is provided in a gap between the semiconductor substrate 211 and a semiconductor substrate 221, which will be described later. The semiconductor substrate 211 is configured of a silicon substrate. The semiconductor substrate 211 has a P-well region 242 in or near a part of a surface thereof, and has a photodiode PD in a region deeper than the P-well region 242. The photodiode PD is configured of an N type semiconductor region. Further, the semiconductor substrate 211 has a floating diffusion FD, which is an N type semiconductor region, in the P-well region 242.

The first substrate unit 210 has a photodiode PD, a transfer transistor TR, and a floating diffusion FD for each sensor pixel 212. The transfer transistor TR and the floating diffusion FD are provided on a front surface side of the semiconductor substrate 211 (a side opposite to the light incidence surface side, the second substrate 220 side). The first substrate unit 210 has an element separation portion 243 that separates the sensor pixels 212 from each other. The element separation portion 243 extends in a normal direction of the front surface of the semiconductor substrate 211. The element separation portion 243 is provided between two sensor pixels 212 adjacent to each other and electrically separates the sensor pixels 212 adjacent to each other from each other. The element separation portion 243 is made of silicon oxide ($SiO_2$). The element separation portion 243 penetrates the semiconductor substrate 211. The first substrate unit 210 further has a P-well region 244 located between the element separation portion 243 and the photodiode PD.

The first substrate unit 210 further has a fixed charge film 245 in contact with a back surface of the semiconductor substrate 211. The fixed charge film 245 is negatively charged in order to inhibit generation of dark current due to an interface state of the semiconductor substrate 211 on a light receiving surface side thereof. The fixed charge film 245 is configured of an insulating film having a negative fixed charge. Examples of a material of such an insulating film include hafnium oxide, zirconium oxide, aluminum oxide, titanium oxide, and tantalum oxide. Due to an electric field induced by the fixed charge film 245, a hole accumulation layer is formed at an interface on the light receiving surface side of the semiconductor substrate 211. This hole accumulation layer inhibits generation of electrons from the interface.

The color filter 240 is provided on the back surface side of the semiconductor substrate 211. The color filter 240 is provided in contact with the fixed charge film 245 and is provided at a position facing the sensor pixel 212 via the fixed charge film 245. The light receiving lens 250 is provided in contact with the color filter 240, and is provided at a position facing the sensor pixel 212 via the color filter 240 and the fixed charge film 245.

The second substrate 220 is configured by laminating an insulating layer 252 on the semiconductor substrate 221. The second substrate 220 has the insulating layer 252 as a part of the interlayer insulating film 251. The insulating layer 252 is provided in a gap between the semiconductor substrate 221 and a semiconductor substrate 231. The semiconductor substrate 221 is made of a silicon substrate. The second substrate 220 has one read circuit 222 for every four sensor pixels 212. The second substrate 220 has a configuration in which the read circuit 222 is provided on a portion of the semiconductor substrate 221 on the front surface side (the third substrate 230 side). The second substrate 220 is bonded to the first substrate unit 210 with the back surface of the semiconductor substrate 221 facing the front surface side of the semiconductor substrate 211. That is, the second substrate 220 is bonded to the first substrate unit 210 by a face to back bonding. The second substrate 220 further has an insulating layer 253 that penetrates the semiconductor substrate 221 in the same layer as the semiconductor substrate 221. The second substrate 220 has the insulating layer 253 as a part of the interlayer insulating film 251. The insulating layer 253 is provided to cover a side surface of a through wiring 254, which will be described later.

A laminate configured of the first substrate unit 210 and the second substrate 220 has the interlayer insulating film 251, and the through wiring 254 provided in the interlayer insulating film 251. The laminate has one through wiring 254 for each sensor pixel 212. The through wiring 254 extends in a normal direction of the semiconductor substrate 221 and is provided so as to penetrate the portion of the interlayer insulating film 251 including the insulating layer 253. The first substrate unit 210 and the second substrate 220 are electrically connected to each other by the through wiring 254. Specifically, the through wiring 254 is electrically connected to the floating diffusion FD and a connection wiring 255, which will be described later.

The second substrate 220 has a plurality of connection portions 259, which are electrically connected to the read circuit 222 and the semiconductor substrate 221, in the insulating layer 252. The second substrate 220 further has, for example, a wiring layer 256 on the insulating layer 252. The wiring layer 256 has an insulating layer 257, a plurality of pixel drive lines 223 provided in the insulating layer 257, and a plurality of vertical signal lines 224. The wiring layer 256 further has a connection wiring 255 for every four sensor pixels 212. The connection wiring 255 is provided in the insulating layer 257. The connection wiring 255 is electrically connected to the floating diffusions FD included in the four sensor pixels 212 that share the read circuit 222 via the through wiring 254.

The wiring layer 256 further has a plurality of pad electrodes 258 in the insulating layer 257. Each pad electrode 258 is made of a metal such as copper (Cu) or aluminum (Al), for example. Each pad electrode 258 is exposed on a front surface of the wiring layer 256. Each pad electrode 258 is used for electrical connection between the second substrate 220 and the third substrate 230 and for bonding the second substrate 220 and the third substrate 230.

The plurality of pad electrodes 258 are provided one by one for each of the pixel drive line 223 and the vertical signal line 224.

The third substrate 230 is configured by laminating an interlayer insulating film 261 on the semiconductor substrate 231. The semiconductor substrate 231 is made of a silicon substrate. The third substrate 230 has a configuration in which a logic circuit 232 is provided on a portion on a front surface side of the semiconductor substrate 231. The third substrate 230 further has a wiring layer 262 on the interlayer insulating film 261. The wiring layer 262 has an insulating layer 263 and a plurality of pad electrodes 264 provided in the insulating layer 263. The plurality of pad electrodes 264 are electrically connected to the logic circuit 232. Each pad electrode 264 is made of, for example, copper (Cu). Each pad electrode 264 is exposed on a front surface of the wiring layer 262. Each pad electrode 264 is used for electrical connection between the second substrate 220 and the third substrate 230 and for bonding the second substrate 220 and the third substrate 230. Further, the number of pad electrodes 264 does not necessarily have to be plural, and one pad electrode 264 can also be electrically connected to the logic circuit 232.

The second substrate 220 and the third substrate 230 are electrically connected to each other by joining the pad electrodes 258 and 264 to each other. That is, the gate (transfer gate) TG of the transfer transistor TR is electrically connected to the logic circuit 232 via the through wiring 254 and the pad electrodes 258 and 264. The third substrate 230 is bonded to the second substrate 220 with the front surface of the semiconductor substrate 231 facing the front surface side of the semiconductor substrate 221. That is, the third substrate 230 is bonded to the second substrate 220 by a face to face bonding.

The read circuit 222 shown in FIG. 19 has an amplification transistor AMP as shown in FIG. 2, a reset transistor RST, and a selection transistor SEL. In addition, at least the amplification transistor AMP among the amplification transistor AMP, the reset transistor RST, and the selection transistor SEL has a fin structure as shown in FIGS. 5 to 7. That is, in the amplification transistor AMP shown in FIG. 19, the semiconductor layer (semiconductor substrate 221) in which the channel is formed has a fin shape. In addition, in the fin-shaped semiconductor layer, crystal planes of the first side surface and the second side surface located on both sides in a channel width direction are (100) planes. Thus, the first specific example of the imaging device can reduce the interface state of the semiconductor layer in which the channel of the amplification transistor AMP is formed, and can reduce noise (for example, 1/f noise) caused by the interface state.

Also, in the first specific example, the reset transistor RST and the selection transistor SEL may have a fin structure like the amplification transistor AMP or may have a structure different from that of the amplification transistor AMP (for example, a planar structure).

Second Specific Example

Figure 20:
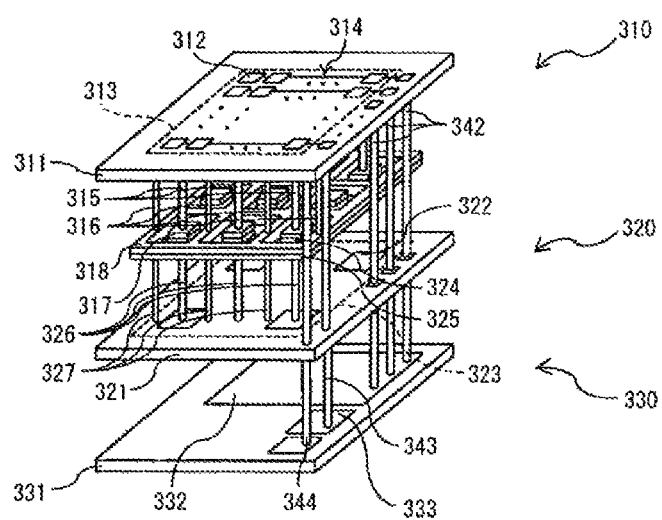
FIG. 20 is a cross-sectional view showing a second specific example of an imaging device according to an embodiment of the present disclosure.

FIG. 20 is a cross-sectional view showing a second specific example of an imaging device according to the embodiments of the present disclosure. As shown in FIG. 20, the imaging device according to the second specific example is an imaging device having a three-dimensional structure in which a first substrate unit 310, a second substrate unit 320, and a third substrate unit 330 are bonded together. The first substrate unit 310, the second substrate unit 320, and the third substrate unit 330 are laminated in this order.

The first substrate unit 310 has a plurality of sensor pixels 312 that perform photoelectric conversion on a semiconductor substrate 311. The plurality of sensor pixels 312 are provided in a matrix shape in a pixel region 313 of the first substrate unit 310. The first substrate unit 310 has a plurality of drive wirings 314 extending in a row direction. The plurality of drive wirings 314 are electrically connected to a vertical drive circuit.

The second substrate unit 320 has one read circuit 322, which outputs a pixel signal based on an electric charge output from the sensor pixel 312, for every one or a plurality of sensor pixels 312 on the semiconductor substrate 321. A plurality of read circuits 322 are provided in a matrix shape in a read circuit region 323 of the second substrate unit 320. The second substrate unit 320 has a plurality of drive wirings extending in a row direction and a plurality of vertical signal lines VSL extending in a column direction (see FIG. 21, which will be described later). The plurality of drive wirings provided on the second substrate unit 320 are electrically connected to the vertical drive circuit. The plurality of vertical signal line VSLs are electrically connected to a column signal processing circuit.

The third substrate unit 330 has a logic circuit 332, and a booster circuit 333 on a semiconductor substrate 331. The logic circuit 332 controls each sensor pixel 312 and each read circuit 322, and processes the pixel signal obtained from each read circuit 322. The logic circuit 332 includes a vertical drive circuit, a column signal processing circuit, a horizontal drive circuit, and a system control circuit. The logic circuit 332 outputs an output voltage obtained from each sensor pixel 312 to the outside.

Figure 21:
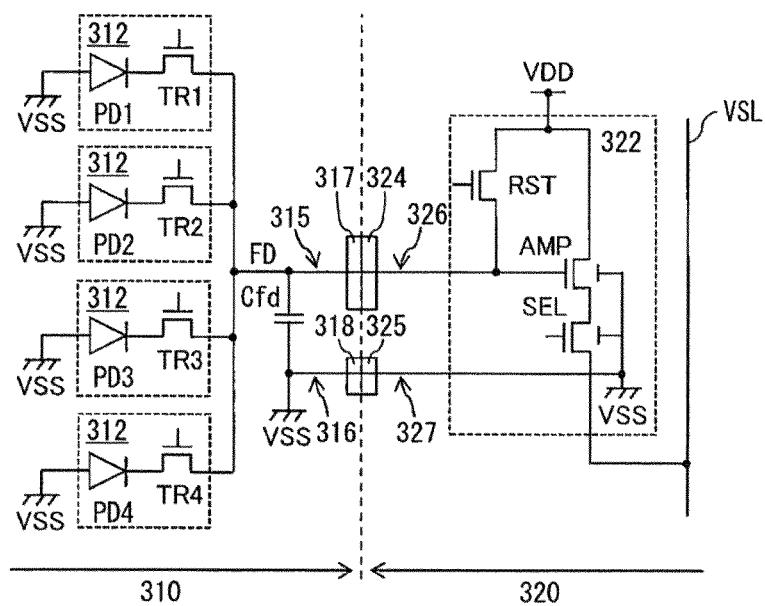
FIG. 21 is a circuit diagram showing the second specific example of the imaging device according to the embodiment of the present disclosure and showing examples of a sensor pixel and a read circuit.

FIG. 21 is a circuit diagram showing the second specific example of the imaging device according to the embodiments of the present disclosure, showing an example of the sensor pixel 312 and the read circuit 322. Each sensor pixel 312 has constituent elements common to each other. Each sensor pixel 312 has a photodiode PD, a transfer transistor TR, and a floating diffusion FD. One floating diffusion FD is provided for a plurality of sensor pixels 312 that share the read circuit 322. In addition, one floating diffusion FD may be provided for one sensor pixel 312. In this case, in the plurality of sensor pixels 312 that share the read circuit 322, a wiring for electrically connecting the floating diffusions FDs to each other is provided.

An input end of the read circuit 322 is connected to the floating diffusion FD. Specifically, to the floating diffusion FD, the reset transistor RST of the read circuit 322 is connected, and the vertical signal line VSL is connected via the amplification transistor AMP and the selection transistor SEL. A capacitance Cfd is generated in the floating diffusion FD. As shown in FIG. 21, the capacitance Cfd is generated between a wiring that connects each sensor pixel 312 to a FD junction electrode 317 and a region (a P-well region 341) serving as a reference potential VSS in the first substrate unit 310.

As shown in FIG. 21, the read circuit 322 has a reset transistor RST, a selection transistor SEL, and an amplification transistor AMP. A source of the reset transistor RST (the input end of the read circuit 322) is electrically connected to the floating diffusion FD, and a drain of the reset transistor RST is electrically connected to a power supply line VDD and a drain of the amplification transistor AMP via a through wiring 343. A gate of the reset transistor RST is electrically connected to the logic circuit 332 via a through wiring 342. A source of the amplification transistor AMP is electrically connected to a drain of the selection transistor SEL, and a gate of the amplification transistor AMP is electrically connected to the source of the reset transistor RST. A source of the selection transistor SEL (an output end of the read circuit 322) is electrically connected to the logic circuit 332 via the vertical signal line VSL and the through wiring 342, and a gate of the selection transistor SEL is electrically connected to the logic circuit 332 via the through wiring 342.

Figure 22:
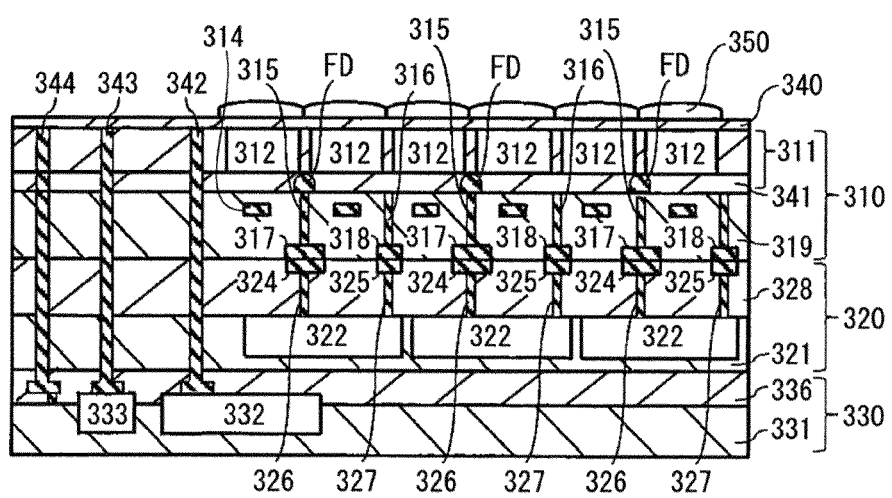
FIG. 22 is a diagram showing the second specific example of the imaging device according to the embodiment of the present disclosure and showing an example of a cross-sectional configuration in a vertical direction.

FIG. 22 is the second specific example of the imaging device according to the embodiments of the present disclosure and is a diagram showing an example of a cross-sectional configuration thereof in the vertical direction. FIG. 22 illustrates a cross-sectional configuration of a portion of the imaging device that faces the pixel region 313 (sensor pixel 312) and a cross-sectional configuration of a region around the pixel region 313. The imaging device includes a color filter 340, and a light receiving lens 350 on a back surface side (a light incidence surface side) of the first substrate unit 310. One color filter 340 and one light receiving lens 350 are provided for each sensor pixel 312. The imaging device is a back side illumination type imaging device.

The first substrate unit 310 is configured by laminating an insulating layer 319 on the semiconductor substrate 311. The insulating layer 319 is an interlayer insulating film. The insulating layer 319 is provided between the semiconductor substrate 311 and the second substrate unit 320. The first substrate unit 310 has the plurality of drive wirings 314 in the insulating layer 319. The plurality of drive wirings 314 are provided one by one for each row in each of the plurality of sensor pixels 312 disposed in a matrix shape. The semiconductor substrate 311 is configured of a silicon substrate. The semiconductor substrate 311 has the P-well region 341 in or near a part of a front surface thereof, and has the photodiode PD in a region other than the P-well region (a region deeper than the P-well region 341). The photodiode PD is configured of an N type semiconductor region. The semiconductor substrate 311 has the floating diffusion FD as an N type semiconductor region in the P-well region 341.

The first substrate unit 310 has a photodiode PD, a transfer transistor TR, and a floating diffusion FD for each sensor pixel 312. The first substrate unit 310 has a configuration in which the transfer transistor TR and the floating diffusion FD are provided on a portion on a front surface side (a side opposite to the light incidence surface side, the second substrate unit 320 side) of the semiconductor substrate 311. The first substrate unit 310 has an element separation portion that separates the sensor pixels 312 from each other. The element separation portion is formed to extend in a normal direction of the front surface of the semiconductor substrate 311. The element separation portion is provided between two sensor pixels 312 adjacent to each other, and electrically separates the sensor pixels 312 adjacent to each other. The element separation portion is made of, for example, silicon oxide. The first substrate unit 310 further has a fixed charge film in contact with a back surface of the semiconductor substrate 311.

The color filter 340 is provided on the back surface side of the semiconductor substrate 311. The color filter 340 is provided in contact with the fixed charge film and is provided at a position that faces the sensor pixel 312 via the fixed charge film. The light receiving lens 350 is provided in contact with the color filter 340 and is provided at a position facing the sensor pixel 312 via the color filter 340 and the fixed charge film.

The first substrate unit 310 has a plurality of FD through wirings 315, and a plurality of VSS through wirings 316 in the insulating layer 319. The plurality of FD through wirings 315 and the plurality of VSS through wirings penetrate the insulating layer 319. Each VSS through wiring 316 is disposed in a gap between two FD penetration wirings 315 adjacent to each other in the plurality of FD penetration wirings 315. The first substrate unit 310 further has a plurality of FD junction electrodes 317, and one VSS junction electrode 318 in the insulating layer 319. The plurality of FD junction electrodes 317 and the one VSS junction electrode 318 are both exposed on a front surface of the insulating layer 319. The plurality of FD through wirings 315 and the plurality of VSS through wirings 316 are provided in a region facing the pixel region 313. Each VSS junction electrode 318 is formed in the same plane as each FD junction electrode 317. The VSS junction electrode 318 is disposed in a gap between two FD junction electrodes 317 adjacent to each other in the plurality of FD junction electrodes 317.

In a case in which one floating diffusion FD is provided for a plurality of sensor pixels 312 that share the read circuit 322, the plurality of FD through wirings 315 are provided one by one for each of the plurality of sensor pixels 312 that share the read circuit 322. In a case in which one floating diffusion FD is provided for one sensor pixel 312, a plurality of FD through wirings 315 are provided one by one for each sensor pixel 312.

Each FD through wiring 315 is connected to the floating diffusion FD and the FD junction electrode 317. In a case in which one floating diffusion FD is provided for a plurality of sensor pixels 312 that share the read circuit 322, the plurality of VSS through wirings 316 are provided one by one for each of the plurality of sensor pixels 312 that share the read circuit 322. In a case in which one floating diffusion FD is provided for one sensor pixel 312, the plurality of VSS through wirings 316 are provided one by one for each sensor pixel 312. Each VSS through wiring 316 is connected to the P-well region 341 and the VSS junction electrode 318. In any case, the plurality of VSS through wirings 316 are provided one by one for each read circuit 322.

The second substrate unit 320 is configured by laminating an insulating layer 328 on the semiconductor substrate 321. The second substrate unit 320 has the insulating layer 328 as an interlayer insulating film. The insulating layer 328 is provided between the semiconductor substrate 321 and the first substrate unit 310. The semiconductor substrate 321 is configured of a silicon substrate. The second substrate unit 320 has one read circuit 322 for every four sensor pixels 312. The second substrate unit 320 has a configuration in which the read circuit 322 is provided on a portion on the front surface side (third substrate unit 330 side) of the semiconductor substrate 321. The second substrate unit 320 is bonded to the first substrate unit 310 with the front surface of the semiconductor substrate 321 facing the front surface side of the semiconductor substrate 311.

The second substrate unit 320 has a plurality of FD through wirings 326 and a plurality of VSS through wirings 327 in the insulating layer 328. The plurality of FD through wirings 326 and the plurality of VSS through wirings 327 penetrate the insulating layer 328. Each VSS through wiring 327 is disposed in a gap between two FD through wirings 326 adjacent to each other in the plurality of FD through wirings 326. The second substrate unit 320 further has a plurality of FD junction electrodes 324 and one VSS junction electrode 325 in the insulating layer 328. The plurality of FD junction electrodes 324 and one VSS junction electrode 325 are both exposed on a front surface of the insulating layer 328.

The plurality of FD junction electrodes 324 are provided one by one for each FD junction electrode 317 of the first substrate unit 310. The FD junction electrode 324 is electrically connected to the FD junction electrode 317. The FD junction electrode 324 and the FD junction electrode 317 are made of, for example, copper and are bonded to each other. The VSS junction electrode 325 is electrically connected to the VSS junction electrode 318 of the first substrate unit 310. The VSS junction electrode 325 and the VSS junction electrode 318 are made of, for example, copper and are bonded to each other. Each VSS junction electrode 325 is formed in the same plane as each FD junction electrode 324. The VSS junction electrode 325 is disposed in a gap between two FD junction electrodes 324 adjacent to each other in the plurality of FD junction electrodes 324. The sensor pixel 312 and the read circuit 322 are electrically connected to each other by joining the FD junction electrodes 317 and 24 to each other.

The FD junction electrodes 317 and 324 are disposed at positions facing the floating diffusions FD. In a case in which the floating diffusion FD is shared by four sensor pixels 312, the floating diffusion FD is provided in a central portion of a region consisting of four sensor pixels 312. Accordingly, in a case in which the floating diffusion FD is shared by the four sensor pixels 312, each of the FD junction electrodes 317 and 324 is disposed at positions facing the central portion of the region consisting of four sensor pixels 312. Each of the FD junction electrodes 317 and 324 has, for example, a rectangular shape.

The plurality of FD junction electrodes 324 and the plurality of FD through wiring 326 are provided in a region facing the pixel region 313. The plurality of FD through wirings 326 are provided one by one for each FD through wiring 315. Each FD through wiring 326 is connected to the FD junction electrode 324 and the read circuit 322 (specifically, the gate of the amplification transistor AMP). The plurality of VSS junction electrodes 325 and the plurality of VSS through wiring 327 are provided in the region facing the pixel region 313. The plurality of VSS through wiring 327 are provided one by one for each VSS through wiring 316. Each VSS through wiring 327 is connected to a VSS junction electrode 325 and a region (a reference potential region of the read circuit 322) to which the reference potential VSS is applied in the second substrate unit 320.

A laminate configured of the first substrate unit 310 and the second substrate unit 320 has the plurality of through wirings 342 that penetrate the first substrate unit 310 and the second substrate unit 320 in the region around the pixel region 313. The plurality of through wirings 342 are provided one by one for each drive wiring 314 of the first substrate unit 310. Each through wiring 342 is connected to the drive wiring 314 and the vertical drive circuit of the logic circuit 332. Accordingly, the logic circuit 332 controls the sensor pixels 312 and the read circuit 322 via the plurality of through wirings 342. Each through wiring 342 is configured of a through silicon via (TSV).

Also, instead of each through wiring 342, a through wiring that penetrates the insulating layer 319 (hereinafter referred to as a "through wiring a"), a through wiring that penetrates the insulating layer 328 (hereinafter referred to as a "through wiring b"), a junction electrode connected to the through wiring a (hereinafter referred to as a "junction electrode c"), and a junction electrode connected to the through wiring b (hereinafter referred to as a "junction electrode d") may be provided. In this case, the junction electrodes c and d are made of, for example, copper, and the junction electrodes c and d are joined to each other.

The laminate configured of the first substrate unit 310 and the second substrate unit 320 further has a through wiring 343 and a through wiring 344 that penetrate the first substrate unit 310 and the second substrate unit 320 around the pixel region 313. The through wirings 343 and 344 are configured of TSVs. The through wiring 343 is connected to the booster circuit 333 of the third substrate unit 330 and has a potential (power supply potential) of the power supply line VDD. The power supply potential is, for example, a value in the range of 2.5V to 2.8V. The through wiring 344 is electrically connected to a region (reference potential region of the third substrate unit 330) to which the reference potential VSS is applied in the third substrate unit 330 and has a reference potential VSS. The reference potential VSS is, for example, zero volt.

The third substrate unit 330 is configured by laminating an insulating layer 336 on the semiconductor substrate 331. The third substrate unit 330 has the insulating layer 336 as an interlayer insulating film. The insulating layer 336 is provided between the semiconductor substrate 331 and the second substrate unit 320. The semiconductor substrate 331 is configured of a silicon substrate. The third substrate unit 330 has a configuration in which the logic circuit 332 is provided on a portion on the front surface side (second substrate unit 320 side) of the semiconductor substrate 331. The third substrate unit 330 is bonded to the second substrate unit 320 with the front surface of the semiconductor substrate 331 facing the back surface side of the semiconductor substrate 321.

The read circuit 322 shown in FIG. 20 has the amplification transistor AMP (see FIG. 21), the reset transistor RST (see FIG. 21), and the selection transistor SEL (see FIG. 21). At least the amplification transistor AMP among the amplification transistor AMP, the reset transistor RST, and the selection transistor SEL has a fin structure as shown in FIGS. 5 to 7. In the fin-shaped semiconductor layer (for example, the semiconductor substrate 321) of the amplification transistor AMP, crystal planes of the first side surface and the second side surface located on both sides in the channel width direction are (100) planes. Thus, the second specific example of the imaging device can reduce the interface state of the semiconductor layer in which the channel of the amplification transistor AMP is formed, and can reduce noise (for example, 1/f noise) caused by the interface state.

In addition, in the second specific example, the reset transistor RST and the selection transistor SEL may have a fin structure like the amplification transistor AMP or may have a structure different from that of the amplification transistor AMP (for example, a planar structure).

Examples of Application to Electronic Devices

For example, the technique according to the present disclosure (the present technique) can be applied to various electronic devices such as an imaging system such as a digital still camera, a digital video camera, or the like (hereinafter collectively referred to as a camera), a mobile device such as a mobile phone having an imaging function, or other devices having an imaging function. For example, the present technique can be applied to an electronic device having an imaging function.

Figure 23:
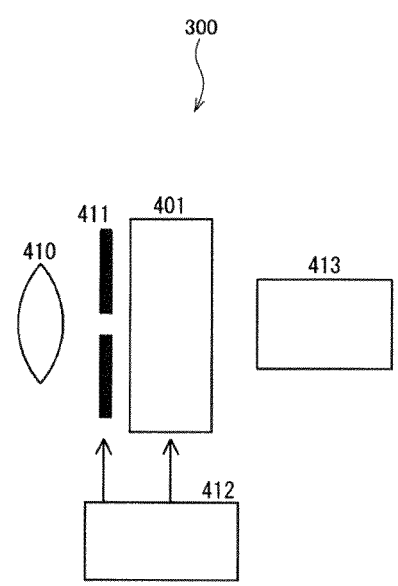
FIG. 23 is a conceptual diagram showing an example in which the technique according to the present disclosure is applied to an electronic device.

FIG. 23 is a conceptual diagram showing an example in which the technique according to the present disclosure (the present technique) is applied to an electronic device 300. As shown in FIG. 23, the electronic device 300 is, for example, a camera and has a solid-state imaging device 401, an optical lens 410, a shutter device 411, a drive circuit 412, and a signal processing circuit 413. The optical lens 410 is an example of the "optical component" of the present disclosure.

Light transmitted through the optical lens 410 is incident on the solid-state imaging device 401. For example, the optical lens 410 forms an image of image light (incident light) from a subject on an imaging surface of the solid-state imaging device 401. Thus, signal charges are accumulated in the solid-state imaging device 401 for a certain period of time. The shutter device 411 controls a light irradiation period and a light blocking period for the solid-state imaging device 401. The drive circuit 412 supplies a drive signal for controlling a transfer operation of the solid-state imaging device 401 and a shutter operation of the shutter device 411. Signal transfer of the solid-state imaging device 401 is performed by the drive signal (timing signal) supplied from the drive circuit 412. The signal processing circuit 413 performs various signal processing. For example, the signal processing circuit 413 processes a signal output from the solid-state imaging device 401. A video signal that has undergone signal processing is stored in a storage medium such as a memory, or is output to a monitor.

In the electronic device 300, one or more of the imaging device 100 according to the first embodiment, the imaging device 100A according to the second embodiment, and the imaging devices according to the first and second specific examples described above are applied to the solid-state imaging device 401. Thus, it is possible to obtain the electronic device 300 with improved performance. Also, the electronic device 300 is not limited to the camera. The electronic device 300 may be a mobile device such as a mobile phone having an imaging function, or other devices having an imaging function.

Other Embodiments

As mentioned above, the present disclosure has been described with the embodiments and the modified examples, but descriptions and figures that form a part of the present disclosure should not be understood as limiting the present disclosure. It is to be understood that various alternative embodiments, examples, and operable techniques will become apparent from the present disclosure to those skilled in the art. It is needless to say that the present technique includes various embodiments that are not described here. At least one of various omissions, substitutions and modifications of constituent elements may be made without departing from the gist of the embodiments, the modified examples, and the specific examples described above. Also, the effects described in the present specification are merely exemplary and not intended as limiting, and other effects may be obtained.

Further, the present disclosure may also have the following structures.

(1) An imaging device including:
a light receiving element; and
a read circuit configured to read an electrical signal photoelectrically converted by the light receiving element,
wherein a field effect transistor included in the read circuit includes
a semiconductor layer in which a channel is formed,
a gate electrode configured to cover the semiconductor layer, and
a gate insulating film disposed between the semiconductor layer and the gate electrode,
the semiconductor layer includes
a main surface, and
a first side surface located on one end side of the main surface in a gate width direction of the field effect transistor,
the gate electrode includes
a first portion configured to face the main surface via the gate insulating film, and
a second portion configured to face the first side surface via the gate insulating film, and
a crystal plane of the first side surface is a (100) plane or a plane equivalent to the (100) plane.
(2) The imaging device according to the above (1),
wherein the semiconductor layer further includes a second side surface located on the other end side of the main surface in the gate width direction,
the gate electrode further includes a third portion configured to face the second side surface via the gate insulating film, and
a crystal plane of the second side surface is a (100) plane or a plane equivalent to the (100) plane.
(3) The imaging device according to the above (1) or (2),
wherein a crystal plane of the main surface is a (100) plane or a plane equivalent to the (100) plane.
(4) The imaging device according to any one of the above (1) to (3),
wherein the read circuit includes, as the field effect transistor, an amplification transistor configured to amplify the electric signal.
(5) The imaging device according to the above (4),
wherein the read circuit further includes, as the field effect transistor, a selection transistor configured to switch connection between the amplification transistor and a signal line on or off.
(6) The imaging device according to the above (4) or (5),
wherein the read circuit further includes, as the field effect transistor, a reset transistor configured to switch connection between the floating diffusion for temporarily holding the electric signal output from the light receiving element and a power supply line on or off.
(7) The imaging device according to any one of the above (1) to (6),
wherein the field effect transistor includes a plurality of the semiconductor layers, and
the plurality of the semiconductor layers are disposed side by side at intervals in the gate width direction of the field effect transistor.
(8) An electronic device comprising:
an optical component;
an imaging device on which light transmitted through the optical component is incident; and
a signal processing circuit configured to process a signal output from the imaging device,
wherein the imaging device includes
a light receiving element; and
a read circuit configured to read an electric signal photoelectrically converted by the light receiving element,
a field effect transistor included in the read circuit includes
a semiconductor layer in which a channel is formed,
a gate electrode configured to cover the semiconductor layer, and a gate insulating film disposed between the semiconductor layer and the gate electrode,
the semiconductor layer includes
a main surface, and
a first side surface located on one end side of the main surface in a gate width direction of the field effect transistor,
the gate electrode includes
a first portion configured to face the main surface via the gate insulating film, and
a second portion configured to face the first side surface via the gate insulating film, and
a crystal plane of the first side surface is a (100) plane or a plane equivalent to the (100) plane.

REFERENCE SIGNS LIST

1 Field effect transistor
1D Drain
1G Gate electrode
1S Source
2 Semiconductor layer
2b, 21b First side surface
2c, 21c Second side surface
3 Semiconductor wafer
3a Upper surface
3N Notch
15 Gate insulating film
20 Gate insulating film
21 Semiconductor layer
21a Upper surface
25 Gate insulating film
30 Gate electrode
31 First portion
32 Second portion
33 Third portion
41 Source region
42 Drain region
43 P-well region
46, 57 Interlayer insulating film
47 N type impurity diffusion layer
48 P+ type impurity diffusion layer
52 Insulating film
54 Through wiring
55 Wiring
59 Through wiring
100, 100A, 100B Imaging device
110 First substrate unit
111 Semiconductor substrate
112 Sensor pixel
113 Pixel region
120 Second substrate unit
121 Semiconductor substrate
122 Read circuit
123 Pixel drive line
124 Vertical signal line
130 Third substrate unit
131 Semiconductor substrate
132 Logic circuit
133 Vertical drive circuit
134 Column signal processing circuit
135 Horizontal drive circuit
136 System control circuit
300 Electronic device
401 Solid-state imaging device
410 Optical lens
411 Shutter device
412 Drive circuit
413 Signal processing circuit
AG, RG, SG Gate electrode
AMP Amplification transistor
RST Reset transistor
SEL Selection transistor
TG Transfer gate
TG Gate (transfer gate)
TR Transfer transistor

What is claimed is:
1. A light detecting device, comprising:
a light receiving element;
a read circuit configured to read an electrical signal photoelectrically converted by the light receiving element; and
a field effect transistor, the field effect transistor comprising:
a semiconductor layer in which a channel is formed;
a gate electrode configured to cover the semiconductor layer; and
a gate insulating film disposed between the semiconductor layer and the gate electrode, wherein the semiconductor layer comprises a first side surface that is perpendicular to a width direction of the channel, and wherein a crystal plane of the first side surface is a (100) plane or a plane equivalent to the (100) plane.

2. The light detecting device according to claim 1, wherein the semiconductor layer further includes a second side surface, and wherein a crystal plane of the second side surface is a (100) plane or a plane equivalent to the (100) plane.

3. The light detecting device according to claim 2, wherein the semiconductor layer further includes a main surface, wherein the first side surface is located on a first end side of the main surface in a gate width direction of the field effect transistor, wherein the second side surface is located on a second end side of the main surface in the gate width direction, and wherein the gate electrode further includes a third portion configured to face the second side surface via the gate insulating film.

4. The light detecting device according to claim 3, wherein a crystal plane of the main surface is a (100) plane or a plane equivalent to the (100) plane.

5. The light detecting device according to claim 1, wherein the read circuit includes, as the field effect transistor, an amplification transistor configured to amplify the electric signal.

6. The light detecting device according to claim 5, wherein the read circuit further includes, as the field effect transistor, a selection transistor configured to switch connection between the amplification transistor and a signal line on or off.

7. The light detecting device according to claim 4, wherein the field effect transistor is included as part of the read circuit.

8. The light detecting device according to claim 7, wherein the read circuit further includes, as the field effect transistor, a reset transistor configured to switch a connection between a floating diffusion for temporarily holding an electric signal output from the light receiving element and a power supply line on or off.

9. The light detecting device according to claim 1, wherein the field effect transistor includes a plurality of the semiconductor layers, and wherein the plurality of the semiconductor layers are disposed side by side at intervals in the gate width direction of the field effect transistor.

10. An electronic device, comprising:
an optical component;
a light detecting device on which light transmitted through the optical component is incident; and
a signal processing circuit configured to process a signal output from the light detecting device,
wherein the light detecting device comprises:
 a light receiving element;
 a read circuit configured to read an electrical signal photoelectrically converted by the light receiving element; and
 a field effect transistor, the field effect transistor comprising:
  a semiconductor layer in which a channel is formed;
  a gate electrode configured to cover the semiconductor layer; and
  a gate insulating film disposed between the semiconductor layer and the gate electrode, wherein the semiconductor layer comprises a first side surface that is perpendicular to a width direction of the channel, and wherein a crystal plane of the first side surface is a (100) plane or a plane equivalent to the (100) plane.

* * * * *